(12) United States Patent
Leahy et al.

(10) Patent No.: US 9,661,739 B2
(45) Date of Patent: May 23, 2017

(54) ELECTRONIC MODULES HAVING GROUNDED ELECTROMAGNETIC SHIELDS

(71) Applicant: RF Micro Devices, Inc., Greensboro, NC (US)

(72) Inventors: Donald Joseph Leahy, Kernersville, NC (US); Brian D. Sawyer, Menlo Park, CA (US); Stephen Parker, Burlington, NC (US); Thomas Scott Morris, Lewisville, NC (US)

(73) Assignee: Qorvo US, Inc., Greeensboro, NC (US)

( * ) Notice: Subject to any disclaimer, the term of this patent is extended or adjusted under 35 U.S.C. 154(b) by 0 days.

(21) Appl. No.: 14/595,401

(22) Filed: Jan. 13, 2015

(65) Prior Publication Data
US 2015/0124421 A1 May 7, 2015

Related U.S. Application Data

(62) Division of application No. 13/034,755, filed on Feb. 25, 2011, now Pat. No. 8,959,762.

(51) Int. Cl.
*H05K 9/00* (2006.01)
*H01L 23/552* (2006.01)
(Continued)

(52) U.S. Cl.
CPC ......... *H05K 1/0216* (2013.01); *H01L 23/552* (2013.01); *H01L 24/97* (2013.01);
(Continued)

(58) Field of Classification Search
CPC .... H05K 1/0216; H05K 1/181; H05K 1/0218; H05K 1/115
(Continued)

(56) References Cited

U.S. PATENT DOCUMENTS 3,566,190 A 2/1971 Huebner et al.
3,907,616 A 9/1975 Wiemer
(Continued)

FOREIGN PATENT DOCUMENTS

CN 1855451 A 11/2006
EP 1715520 B1 10/2006
(Continued)

OTHER PUBLICATIONS

Notice of Allowance for U.S. Appl. No. 13/189,838, mailed Jul. 30, 2015, 5 pages.
(Continued)

*Primary Examiner* — Sherman Ng
(74) *Attorney, Agent, or Firm* — Withrow & Terranova, P.L.L.C.

(57) ABSTRACT

In one embodiment, a meta-module having circuitry for two or more modules is formed on a substrate, which is preferably a laminated substrate. The circuitry for the different modules is initially formed on the single meta-module. Each module will have one or more component areas in which the circuitry is formed. A metallic structure is formed on or in the substrate for each component area to be shielded. A single body, such as an overmold body, is then formed over all of the modules on the meta-module. At least a portion of the metallic structure for each component area to be shielded is then exposed through the body by a cutting, drilling, or like operation. Next, an electromagnetic shield material is applied to the exterior surface of the body of each of the component areas to be shielded and in contact with the exposed portion of the metallic structures.

8 Claims, 41 Drawing Sheets

(51) Int. Cl.
  *H05K 1/02*    (2006.01)
  *H05K 3/28*    (2006.01)
  *H01L 23/00*   (2006.01)
  *H05K 1/11*    (2006.01)
  *H05K 1/18*    (2006.01)
  *H05K 3/00*    (2006.01)
  *H05K 3/46*    (2006.01)

(52) U.S. Cl.
  CPC .......... *H05K 1/0218* (2013.01); *H05K 1/115* (2013.01); *H05K 1/181* (2013.01); *H05K 3/0097* (2013.01); *H05K 3/284* (2013.01); *H01L 2924/1461* (2013.01); *H05K 3/0052* (2013.01); *H05K 3/4614* (2013.01); *H05K 2201/0715* (2013.01); *H05K 2201/0949* (2013.01); *H05K 2201/09618* (2013.01); *H05K 2201/09709* (2013.01); *Y10T 29/4913* (2015.01); *Y10T 29/49124* (2015.01); *Y10T 29/49146* (2015.01); *Y10T 29/49171* (2015.01)

(58) Field of Classification Search
  USPC ................................ 174/350; 257/659, 660
  See application file for complete search history.

(56) References Cited

U.S. PATENT DOCUMENTS

| | | | |
|---|---|---|---|
| 3,907,617 A | 9/1975 | Zwernemann | |
| 4,680,676 A | 7/1987 | Petratos et al. | |
| 5,329,695 A | 7/1994 | Traskos et al. | |
| 5,389,738 A | 2/1995 | Piosenka et al. | |
| 5,406,630 A | 4/1995 | Piosenka et al. | |
| 5,436,203 A | 7/1995 | Lin | |
| 5,459,368 A | 10/1995 | Onishi et al. | |
| 5,473,512 A | 12/1995 | Degani et al. | |
| 5,592,391 A | 1/1997 | Muyshondt et al. | |
| 5,623,293 A | 4/1997 | Aoki | |
| 5,639,989 A | 6/1997 | Higgins, III | |
| 5,646,828 A | 7/1997 | Degani et al. | |
| 5,650,659 A | 7/1997 | Mostafazadeh et al. | |
| 5,870,289 A | 2/1999 | Tokuda et al. | |
| 5,977,626 A | 11/1999 | Wang et al. | |
| 6,004,180 A | 12/1999 | Knall et al. | |
| 6,011,698 A | 1/2000 | Buehler | |
| 6,137,693 A | 10/2000 | Schwiebert et al. | |
| 6,150,193 A | 11/2000 | Glenn | |
| 6,163,454 A | 12/2000 | Strickler | |
| 6,297,957 B1 | 10/2001 | Johnson et al. | |
| 6,429,386 B2 | 8/2002 | DiBene, II et al. | |
| 6,448,583 B1 | 9/2002 | Yoneda et al. | |
| 6,448,793 B1 | 9/2002 | Barratt et al. | |
| 6,466,416 B1 | 10/2002 | Honjo et al. | |
| 6,538,196 B1 | 3/2003 | MacDonald et al. | |
| 6,590,152 B1 | 7/2003 | Horio et al. | |
| 6,599,779 B2 | 7/2003 | Shim et al. | |
| 6,613,660 B2 | 9/2003 | Kahlert et al. | |
| 6,633,073 B2 | 10/2003 | Rezvani et al. | |
| 6,657,592 B2 | 12/2003 | Dening et al. | |
| 6,707,168 B1 | 3/2004 | Hoffman et al. | |
| 6,717,485 B2 | 4/2004 | Kolb et al. | |
| 6,791,795 B2 | 9/2004 | Ohtomo et al. | |
| 6,807,731 B2 | 10/2004 | Brandenburg et al. | |
| 6,825,560 B1 | 11/2004 | Walker et al. | |
| 6,838,750 B2 | 1/2005 | Nuytkens et al. | |
| 6,887,787 B2 | 5/2005 | Farnworth | |
| 6,894,229 B1 | 5/2005 | Cheah | |
| 6,900,383 B2 | 5/2005 | Babb et al. | |
| 6,946,324 B1 | 9/2005 | McLellan et al. | |
| 6,947,295 B2 | 9/2005 | Hsieh | |
| 6,998,532 B2 | 2/2006 | Kawamoto et al. | |
| 7,030,469 B2 | 4/2006 | Mahadevan et al. | |
| 7,042,398 B2 | 5/2006 | Tang et al. | |
| 7,087,461 B2 | 8/2006 | Park et al. | |
| 7,087,462 B1 | 8/2006 | Park et al. | |
| 7,109,410 B2 | 9/2006 | Arnold et al. | |
| 7,109,817 B2 | 9/2006 | Kolb et al. | |
| 7,125,744 B2 | 10/2006 | Takehara et al. | |
| 7,148,574 B2 | 12/2006 | Lee et al. | |
| 7,187,060 B2 | 3/2007 | Usui | |
| 7,227,719 B2 | 6/2007 | Sasaki et al. | |
| 7,259,041 B2 | 8/2007 | Stelzl et al. | |
| 7,342,303 B1 | 3/2008 | Berry et al. | |
| 7,348,663 B1 | 3/2008 | Kirloskar et al. | |
| 7,433,203 B1 | 10/2008 | Yi et al. | |
| 7,443,693 B2 | 10/2008 | Arnold et al. | |
| 7,445,968 B2 | 11/2008 | Harrison et al. | |
| 7,478,474 B2 | 1/2009 | Koga | |
| 7,488,903 B2 | 2/2009 | Kawagishi et al. | |
| 7,514,772 B2 | 4/2009 | Kobayashi et al. | |
| 7,548,430 B1 | 6/2009 | Huemoeller et al. | |
| 7,598,606 B2 | 10/2009 | Chow et al. | |
| 7,633,170 B2 | 12/2009 | Yang et al. | |
| 7,633,765 B1 | 12/2009 | Scanlan et al. | |
| 7,635,918 B2 | 12/2009 | Yoshida | |
| 7,636,245 B2 | 12/2009 | Clancy et al. | |
| 7,643,311 B2 | 1/2010 | Coffy | |
| 7,651,889 B2 | 1/2010 | Tang et al. | |
| 7,665,201 B2 | 2/2010 | Sjoedin | |
| 7,671,451 B2 | 3/2010 | Lee et al. | |
| 7,700,411 B2 | 4/2010 | Yang et al. | |
| 7,701,728 B2 | 4/2010 | Hatanaka et al. | |
| 7,772,046 B2 * | 8/2010 | Pagaila | H01L 23/29 257/E21.502 |
| 7,829,981 B2 | 11/2010 | Hsu | |
| 7,902,643 B2 | 3/2011 | Tuttle | |
| 7,902,644 B2 | 3/2011 | Huang et al. | |
| 7,928,538 B2 | 4/2011 | Salzman | |
| 8,013,258 B2 | 9/2011 | Wu | |
| 8,084,300 B1 * | 12/2011 | San Antonio | H01L 21/561 257/E21.602 |
| 8,093,690 B2 | 1/2012 | Ko et al. | |
| 8,110,441 B2 | 2/2012 | Chandra et al. | |
| 8,268,677 B1 | 9/2012 | Pagaila | |
| 8,373,264 B2 | 2/2013 | Welch et al. | |
| 8,507,319 B2 | 8/2013 | Chow et al. | |
| 8,748,230 B2 | 6/2014 | Welch et al. | |
| 8,861,221 B2 | 10/2014 | Pagaila | |
| 2002/0036345 A1 | 3/2002 | Iseki et al. | |
| 2002/0118529 A1 | 8/2002 | Babin et al. | |
| 2002/0142516 A1 | 10/2002 | Light | |
| 2003/0011049 A1 | 1/2003 | Nuytkens et al. | |
| 2003/0048581 A1 | 3/2003 | Ohtomo et al. | |
| 2003/0062541 A1 | 4/2003 | Warner | |
| 2003/0090883 A1 | 5/2003 | Asahi et al. | |
| 2003/0151122 A1 | 8/2003 | Davies | |
| 2004/0063246 A1 | 4/2004 | Karnezos | |
| 2004/0103509 A1 | 6/2004 | Bidard et al. | |
| 2004/0104473 A1 | 6/2004 | Farnworth | |
| 2004/0178500 A1 | 9/2004 | Usui | |
| 2004/0209434 A1 | 10/2004 | Seaford et al. | |
| 2004/0214023 A1 | 10/2004 | Park et al. | |
| 2004/0222511 A1 * | 11/2004 | Zhang | H01L 23/552 257/686 |
| 2004/0232536 A1 | 11/2004 | Fukuzumi | |
| 2004/0238934 A1 | 12/2004 | Warner et al. | |
| 2005/0046001 A1 | 3/2005 | Warner | |
| 2005/0153061 A1 | 7/2005 | Nuytkens et al. | |
| 2006/0033184 A1 | 2/2006 | Park et al. | |
| 2006/0151203 A1 | 7/2006 | Krueger et al. | |
| 2006/0223577 A1 | 10/2006 | Ouzillou | |
| 2006/0244131 A1 | 11/2006 | Kobayashi et al. | |
| 2006/0266547 A1 * | 11/2006 | Koga | H01L 21/561 174/255 |
| 2006/0273813 A1 | 12/2006 | Coffy | |
| 2006/0274517 A1 | 12/2006 | Coffy | |
| 2007/0030661 A1 * | 2/2007 | Morris | C23C 30/00 361/818 |
| 2007/0042593 A1 | 2/2007 | Lee et al. | |
| 2007/0045248 A1 | 3/2007 | Schein et al. | |
| 2007/0058748 A1 | 3/2007 | Kim et al. | |
| 2007/0062637 A1 | 3/2007 | Sjoedin | |
| 2007/0155053 A1 | 7/2007 | Karnezos | |
| 2007/0163802 A1 | 7/2007 | Monthei | |

(56) References Cited

U.S. PATENT DOCUMENTS

| | | |
|---|---|---|
| 2007/0200210 A1 | 8/2007 | Zhao et al. |
| 2007/0221399 A1 | 9/2007 | Nishizawa et al. |
| 2007/0222697 A1 | 9/2007 | Caimi et al. |
| 2007/0290322 A1 | 12/2007 | Zhao et al. |
| 2008/0019112 A1 | 1/2008 | Hatanaka et al. |
| 2008/0054421 A1 | 3/2008 | Dimaano et al. |
| 2008/0108179 A1 | 5/2008 | Mistry et al. |
| 2008/0112151 A1 | 5/2008 | Thompson et al. |
| 2008/0139013 A1 | 6/2008 | Tomura et al. |
| 2008/0142938 A1 | 6/2008 | Chow et al. |
| 2008/0157316 A1 | 7/2008 | Yang |
| 2008/0210462 A1 | 9/2008 | Kawagishi et al. |
| 2008/0224306 A1 | 9/2008 | Yang |
| 2008/0308912 A1 | 12/2008 | Cha et al. |
| 2008/0317188 A1 | 12/2008 | Staszewski et al. |
| 2009/0009979 A1 | 1/2009 | Mori et al. |
| 2009/0016039 A1 | 1/2009 | Imamura |
| 2009/0051011 A1 | 2/2009 | Usami |
| 2009/0066588 A1 | 3/2009 | Cheng et al. |
| 2009/0072357 A1 | 3/2009 | Tang et al. |
| 2009/0072364 A1 | 3/2009 | Punzalan et al. |
| 2009/0079041 A1 | 3/2009 | Huang et al. |
| 2009/0140402 A1 | 6/2009 | Ohtani |
| 2009/0227273 A1 | 9/2009 | McCune, Jr. |
| 2009/0233562 A1 | 9/2009 | Kim et al. |
| 2009/0270054 A1 | 10/2009 | Ridgers et al. |
| 2009/0302438 A1 | 12/2009 | Chauhan et al. |
| 2009/0315156 A1 | 12/2009 | Harper |
| 2010/0032815 A1* | 2/2010 | An .................. H01L 23/3121 257/660 |
| 2010/0051343 A1* | 3/2010 | Lam .................. H01L 21/561 174/350 |
| 2010/0123233 A1 | 5/2010 | Yoon et al. |
| 2010/0207258 A1* | 8/2010 | Eun .................. H01L 23/055 257/660 |
| 2010/0224992 A1 | 9/2010 | McConnelee et al. |
| 2010/0279730 A1 | 11/2010 | Ortiz |
| 2011/0014880 A1 | 1/2011 | Nicolson et al. |
| 2011/0017263 A1 | 1/2011 | Gibson et al. |
| 2011/0084378 A1 | 4/2011 | Welch et al. |
| 2011/0085314 A1 | 4/2011 | Franz |
| 2011/0114369 A1 | 5/2011 | Lee et al. |
| 2011/0182048 A1 | 7/2011 | Roethlingshoefer et al. |
| 2011/0298109 A1 | 12/2011 | Pagaila et al. |
| 2011/0298670 A1 | 12/2011 | Jung et al. |
| 2012/0044653 A1 | 2/2012 | Morris et al. |
| 2012/0074538 A1 | 3/2012 | Tsai et al. |
| 2012/0075821 A1 | 3/2012 | Pagaila |
| 2012/0126378 A1 | 5/2012 | San Antonio et al. |
| 2012/0182706 A1 | 7/2012 | Siomkos et al. |
| 2012/0217624 A1 | 8/2012 | Morris et al. |
| 2012/0218729 A1 | 8/2012 | Carey et al. |
| 2012/0270371 A1 | 10/2012 | DeBar et al. |
| 2014/0097007 A1 | 4/2014 | Nagai et al. |
| 2014/0182920 A1 | 7/2014 | Yanagisawa et al. |
| 2014/0262442 A1 | 9/2014 | Nomura et al. |
| 2014/0268587 A1 | 9/2014 | Nomura et al. |
| 2015/0091157 A9 | 4/2015 | Chi et al. |

FOREIGN PATENT DOCUMENTS

| | | |
|---|---|---|
| EP | 1717857 A2 | 11/2006 |
| EP | 1764834 B1 | 3/2009 |
| JP | H11163583 A | 6/1999 |
| JP | 2004207352 A | 7/2004 |
| JP | 2005039007 A | 2/2005 |
| JP | 2005109306 A | 4/2005 |
| JP | 2006332255 A | 12/2006 |
| JP | 2007311396 A | 11/2007 |
| KR | 20060113412 A | 11/2006 |
| WO | 0035085 A1 | 6/2000 |
| WO | 03058812 A1 | 7/2003 |
| WO | 2004019490 A1 | 3/2004 |
| WO | 2004060034 A1 | 7/2004 |
| WO | 2007060784 A1 | 5/2007 |
| WO | 2007132560 A1 | 11/2007 |
| WO | 2009144960 A1 | 12/2009 |
| WO | 2010014103 A1 | 2/2010 |
| WO | 2010021262 A1 | 2/2010 |

OTHER PUBLICATIONS

Final Office Action for U.S. Appl. No. 14/447,847, mailed Sep. 14, 2015, 8 pages.
Non-Final Office Action for U.S. Appl. No. 13/906,892, mailed Aug. 10, 2015, 10 pages.
Notice of Allowance for U.S. Appl. No. 11/199,319, mailed Oct. 2, 2008, 6 pages.
Non-Final Office Action for U.S. Appl. No. 11/435,913, mailed May 21, 2010, 5 pages.
Final Office Action for U.S. Appl. No. 11/435,913, mailed Nov. 17, 2009, 8 pages.
Non-Final Office Action for U.S. Appl. No. 11/435,913, mailed Mar. 2, 2009, 8 pages.
Final Office Action for U.S. Appl. No. 11/435,913, mailed Aug. 15, 2008, 8 pages.
Non-Final Office Action for U.S. Appl. No. 11/435,913, mailed Jan. 7, 2008, 7 pages.
Non-Final Office Action for U.S. Appl. No. 11/768,014, mailed Jan. 21, 2009, 9 pages.
Non-Final Office for U.S. Appl. No. 11/768,014, mailed Mar. 25, 2010, 9 pages.
Non-Final Office for U.S. Appl. No. 11/768,014, mailed Jul. 10, 2009, 7 pages.
Notice of Allowance for U.S. Appl. No. 13/187,814, mailed Sep. 10, 2012, 8 pages.
Non-Final Office Action for U.S. Appl. No. 11/952,484, mailed Jan. 8, 2010, 17 pages.
Final Office Action for U.S. Appl. No. 11/952,484, mailed Oct. 5, 2010, 19 pages.
Non-Final Office Action for U.S. Appl. No. 11/952,484, mailed Oct. 27, 2011, 22 pages.
Non-Final Office Action for U.S. Appl. No. 13/415,643, mailed Jan. 3, 2013, 17 pages.
Quayle Action for U.S. Appl. No. 13/415,643, mailed Jul. 11, 2013, 6 pages.
Notice of Allowance for U.S. Appl. No. 13/415,643, mailed Aug. 15, 2013, 8 pages.
Non-Final Office Action for U.S. Appl. No. 11/952,513, mailed May 10, 2011, 19 pages.
Final Office Action for U.S. Appl. No. 11/952,513, mailed Oct. 26, 2011, 16 pages.
Notice of Allowance for U.S. Appl. No. 11/952,513, mailed Mar. 6, 2012, 9 pages.
Non-Final Office Action for U.S. Appl. No. 13/117,284, mailed Nov. 9, 2011, 12 pages.
Final Office Action for U.S. Appl. No. 13/117,284, mailed Feb. 29, 2012, 8 pages.
Notice of Allowance for U.S. Appl. No. 13/117,284, mailed May 1, 2012, 8 pages.
Non-Final Office Action for U.S. Appl. No. 11/952,545, mailed Oct. 23, 2009, 12 pages.
Non-Final Office Action for U.S. Appl. No. 12/766,347, mailed Jun. 29, 2012, 11 pages.
Notice of Allowance for U.S. Appl. No. 11/952,592, mailed Aug. 6, 2012, 7 pages.
Non-Final Office Action for U.S. Appl. No. 11/952,592, mailed Sep. 19, 2011, 9 pages.
Final Office Action for U.S. Appl. No. 11/952,592, mailed Feb. 24, 2011, 9 pages.
Non-Final Office Action for U.S. Appl. No. 11/952,592, mailed Dec. 15, 2010, 9 pages.
Non-Final Office Action for U.S. Appl. No. 11/952,592, mailed Jul. 28, 2009, 7 pages.
Final Office Action for U.S. Appl. No. 11/952,592, mailed Apr. 16, 2010, 8 pages.

(56) References Cited

OTHER PUBLICATIONS

Final Office Action for U.S. Appl. No. 11/952,592, mailed Jan. 18, 2012, 10 pages.
Non-Final Office Action for U.S. Appl. No. 11/952,592, mailed Jun. 12, 2012, 10 pages.
Notice of Allowance for U.S. Appl. No. 11/952,617, mailed Jan. 8, 2013, 8 pages.
Notice of Allowance for U.S. Appl. No. 11/952,617, mailed Jun. 4, 2012, 9 pages.
Final Office Action for U.S. Appl. No. 11/952,617, mailed Feb. 16, 2012, 7 pages.
Non-Final Office Action for U.S. Appl. No. 11/952,617, mailed Jul. 28, 2011, 9 pages.
Non-Final Office Action for U.S. Appl. No. 11/952,617, mailed Sep. 26, 2008, 10 pages.
Final Office Action for U.S. Appl. No. 11/952,617, mailed Nov. 20, 2009, 16 pages.
Non-Final Office Action for U.S. Appl. No. 11/952,634, mailed Jun. 13, 2011, 7 pages.
Final Office Action for U.S. Appl. No. 11/952,634, mailed Feb. 1, 2011, 7 pages.
Final Office Action for U.S. Appl. No. 11/952,634, mailed Dec. 23, 2010, 8 pages.
Non-Final Office Action for U.S. Appl. No. 11/952,634, mailed Jul. 21, 2010, 7 pages.
Notice of Allowance for U.S. Appl. No. 13/151,499, mailed Dec. 19, 2013, 8 pages.
International Search Report for PCT/US2008/068153, mailed Dec. 9, 2008, 3 pages.
Office Action for Chinese Patent Application No. 200880104171.1, mailed Jun. 2, 2011, 20 pages.
Second Office Action for Chinese Patent Application No. 200880104171.1, mailed Feb. 16, 2012, 8 pages.
Non-Final Office Action for U.S. Appl. No. 11/952,670, mailed Jun. 22, 2011, 4 pages.
Non-Final Office Action for U.S. Appl. No. 11/952,670, mailed May 27, 2010, 6 pages.
Notice of Allowance for U.S. Appl. No. 11/952,670, mailed Oct. 21, 2009, 6 pages.
Notice of Allowance for U.S. Appl. No. 11/952,670, mailed Aug. 24, 2012, 7 pages.
Notice of Allowance for U.S. Appl. No. 11/952,690, mailed Aug. 30, 2010, 9 pages.
Non-Final Office Action for U.S. Appl. No. 11/952,690, mailed Mar. 25, 2010, 9 pages.
Non-Final Rejection for U.S. Appl. No. 12/913,364, mailed Feb. 13, 2012, 6 pages.
Notice of Allowance for U.S. Appl. No. 12/913,364, mailed Jun. 8, 2012, 8 pages.
Non-Final Office Action for U.S. Appl. No. 13/189,838, mailed Mar. 14, 2014, 14 pages.
Final Office Action for U.S. Appl. No. 13/189,838, mailed Jun. 19, 2014, 10 pages.
Advisory Action for U.S. Appl. No. 13/189,838, mailed Aug. 28, 2014, 2 pages.
Non-Final Office Action for U.S. Appl. No. 13/189,838, mailed Oct. 28, 2014, 11 pages.
Final Office Action for U.S. Appl. No. 13/189,838, mailed Feb. 20, 2015, 13 pages.
Non-Final Office Action for U.S. Appl. No. 13/034,755, mailed Aug. 15, 2013, 6 pages.
Final Office Action for U.S. Appl. No. 13/034,755, mailed Jan. 31, 2014, 10 pages.
Advisory Action for U.S. Appl. No. 13/034,755, mailed Mar. 4, 2014, 3 pages.
Notice of Allowance for U.S. Appl. No. 13/034,755, mailed Oct. 17, 2014, 7 pages.
Non-Final Office Action for U.S. Appl. No. 13/034,787, mailed Jan. 16, 2013, 9 pages.
Final Office Action for U.S. Appl. No. 13/034,787, mailed Mar. 19, 2013, 9 pages.
Advisory Action for U.S. Appl. No. 13/034,787, mailed May 17, 2013, 3 pages.
Non-Final Office Action for U.S. Appl. No. 13/034,787, mailed Aug. 9, 2013, 9 pages.
Final Office Action for U.S. Appl. No. 13/034,787, mailed Nov. 15, 2013, 12 pages.
Advisory Action for U.S. Appl. No. 13/034,787, mailed Jan. 27, 2014, 4 pages.
Advisory Action for U.S. Appl. No. 13/034,787, mailed Feb. 26, 2014, 4 pages.
Notice of Allowance for U.S. Appl. No. 13/034,787, mailed May 1, 2014, 9 pages.
Corrected Notice of Allowability for U.S. Appl. No. 13/034,787, mailed Jul. 29, 2014, 5 pages.
Non-Final Office Action for U.S. Appl. No. 12/797,381, mailed Jan. 8, 2013, 20 pages.
Final Office Action for U.S. Appl. No. 12/797,381, mailed May 16, 2013, 19 pages.
Advisory Action for U.S. Appl. No. 12/797,381, mailed Jul. 17, 2013, 3 pages.
Examiner's Answer for U.S. Appl. No. 12/797,381, mailed Dec. 31, 2013, 6 pages.
Final Office Action for U.S. Appl. No. 13/036,272, mailed Oct. 20, 2014, 6 pages.
Advisory Action for U.S. Appl. No. 13/036,272, mailed Jan. 8, 2015, 3 pages.
Author Unknown, "Cho-Shield Conductive Coatings," Chomerics—EMI Products, Copyright: 2001, 1 page, Retrieved from http://www.chomerics.com/products/choshield_coatings.htm.
Author Unknown, "Cho-Shield Conductive Coatings," Chomerics: A Division of Parker Hannifin Corporation, Dec. 8, 2000, 3 pages, Retrieved from: http://www.chomerics.com/products/choshield_coatings.htm.
Author Unknown, "Fractional-N RF Synthesizer with Modulator and Digital IF Filter (RF6001)," RF Micro Devices: Part of the Polaris Total Radio Solution, 2005, 2 pages.
Notice of Allowance for U.S. Appl. No. 13/189,838, mailed May 4, 2015, 8 pages.
Non-Final Office Action for U.S. Appl. No. 13/036,272, mailed Apr. 14, 2015, 7 pages.
Non-Final Office Action for U.S. Appl. No. 14/447,847, mailed May 7, 2015, 7 pages.
Final Office Action for U.S. Appl. No. 13/036,272, mailed Nov. 19, 2015, 9 pages.
Final Office Action for U.S. Appl. No. 14/447,847, mailed Dec. 11, 2015, 8 pages.
Advisory Action for U.S. Appl. No. 13/036,272, mailed Feb. 5, 2016, 3 pages.
Final Office Action for U.S. Appl. No. 13/906,892, mailed Feb. 11, 2016, 10 pages.
Corrected Notice of Allowability for U.S. Appl. No. 14/447,847, mailed Jul. 15, 2016, 4 pages.
Advisory Action for U.S. Appl. No. 13/906,892, mailed Jun. 15, 2016, 2 pages.
Decision on Appeal for U.S. Appl. No. 12/797,381, mailed Mar. 11, 2016, 6 pages.
Non-Final Office Action for U.S. Appl. No. 13/036,272, mailed Apr. 8, 2016, 7 pages.
Notice of Allowance for U.S. Appl. No. 14/447,847, mailed Feb. 29, 2016, 7 pages.
Notice of Allowance for U.S. Appl. No. 14/447,847, mailed Mar. 31, 2016, 7 pages.
Notice of Allowance for U.S. Appl. No. 13/036,272, mailed Sep. 30, 2016, 5 pages.
Final Office Action for U.S. Appl. No. 13/906,892, mailed Aug. 26, 2016, 11 pages.
Advisory Action for U.S. Appl. No. 13/906,892, mailed Nov. 28, 2016, 3 pages.
Final Office Action for U.S. Appl. No. 13/906,892, mailed Dec. 15, 2016, 11 pages.

(56) References Cited

OTHER PUBLICATIONS

Advisory Action for U.S. Appl. No. 13/906,892, mailed Mar. 14, 2017, 3 pages.
Non-Final Office Action for U.S. Appl. No. 13/906,892, mailed Apr. 3, 2017, 9 pages.

* cited by examiner

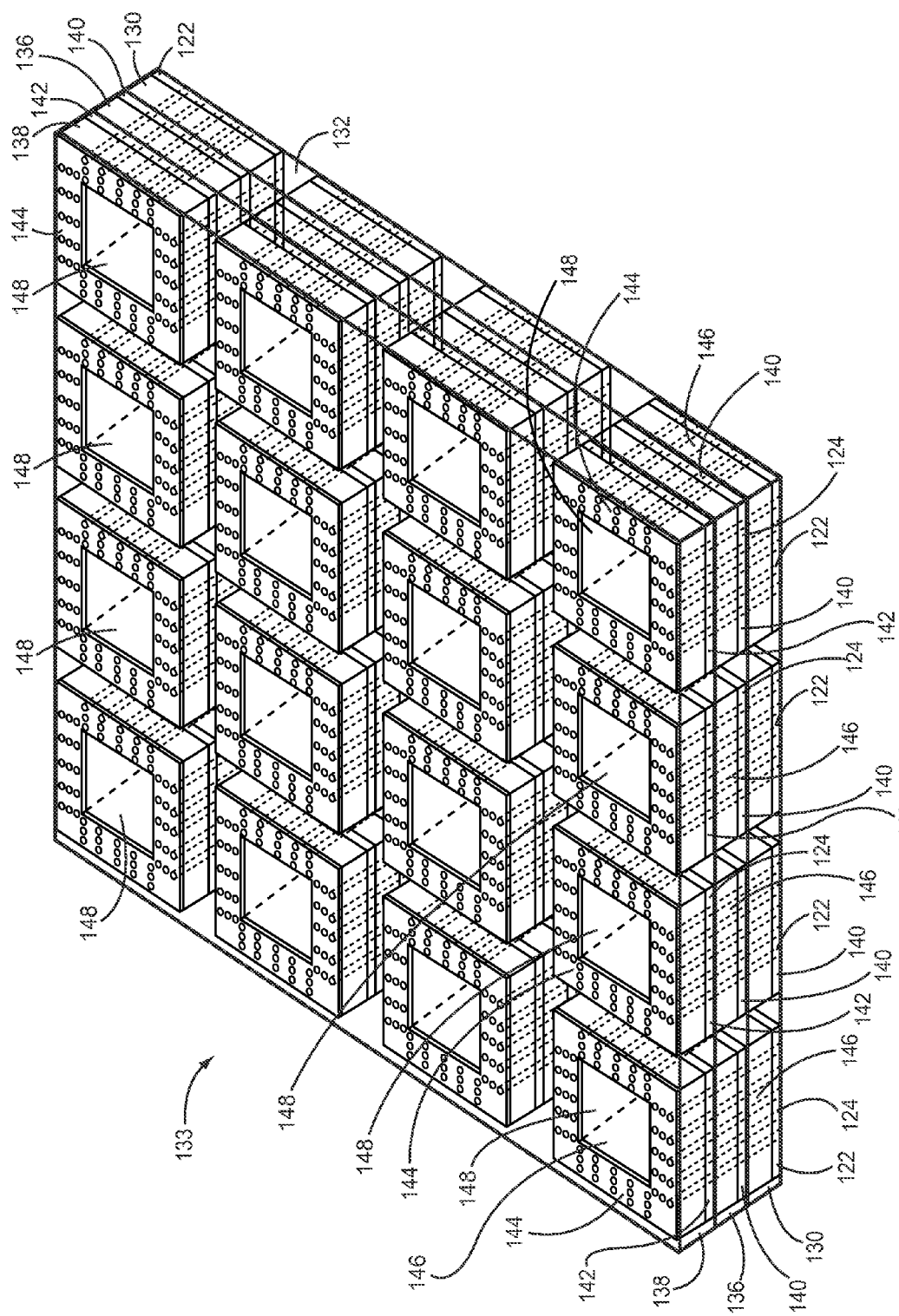

ELECTRONIC MODULES HAVING GROUNDED ELECTROMAGNETIC SHIELDS

This application is a Division of U.S. Utility patent application Ser. No. 13/034,755, filed Feb. 25, 2011, the disclosure of which is incorporated herein by reference in its entirety.

CROSS-REFERENCE TO RELATED APPLICATIONS

This application is related to U.S. Utility patent application Ser. No. 11/199,319 filed Aug. 8, 2005, now U.S. Pat. No. 7,451,539; and U.S. Utility patent application Ser. No. 11/435,913 filed May 17, 2006, now U.S. Pat. No. 8,062,930, the disclosures of which are hereby incorporated herein by reference in their entireties. This application is also related to the following U.S. patent applications: application Ser. No. 11/768,014, filed Jun. 25, 2007, entitled INTEGRATED SHIELD FOR A NO-LEAD SEMICONDUCTOR DEVICE PACKAGE, now U.S. Pat. No. 8,053,872; application Ser. No. 11/952,484, filed Dec. 7, 2007, entitled FIELD BARRIER STRUCTURES WITHIN A CONFORMAL SHIELD, now abandoned; application Ser. No. 11/952,513, filed Dec. 7, 2007, entitled ISOLATED CONFORMAL SHIELDING, now U.S. Pat. No. 8,220,145; application Ser. No. 11/952,545, filed Dec. 7, 2007, entitled CONFORMAL SHIELDING EMPLOYING SEGMENT BUILDUP, now abandoned; application Ser. No. 11/952,592, filed Dec. 7, 2007, entitled CONFORMAL SHIELDING PROCESS USING FLUSH STRUCTURES, now U.S. Pat. No. 8,409,658; application Ser. No. 11/952,617, filed Dec. 7, 2007, entitled HEAT SINK FORMED WITH CONFORMAL SHIELD, now U.S. Pat. No. 8,434,220; application Ser. No. 11/952,634, filed Dec. 7, 2007, entitled CONFORMAL SHIELDING PROCESS USING PROCESS GASES, now U.S. Pat. No. 8,186,048; application Ser. No. 11/952,670, filed Dec. 7, 2007, entitled BOTTOM SIDE SUPPORT STRUCTURE FOR CONFORMAL SHIELDING PROCESS, now U.S. Pat. No. 8,359,739; application Ser. No. 11/952,690, filed Dec. 7, 2007, entitled BACKSIDE SEAL FOR CONFORMAL SHIELDING PROCESS, now U.S. Pat. No. 8,061,012; application Ser. No. 12/913,364, filed Oct. 27, 2010, entitled BACKSIDE SEAL FOR CONFORMAL SHIELDING PROCESS, now U.S. Pat. No. 8,296,938; and application Ser. No. 12/797,381, filed Jun. 9, 2010, entitled INTEGRATED POWER AMPLIFIER AND TRANSCEIVER; all of which are commonly owned and assigned, at the time of the invention, and are hereby incorporated herein by reference in their entireties.

FIELD OF THE DISCLOSURE

The present disclosure relates to electronic modules having electromagnetic shields and methods of manufacturing the same.

BACKGROUND

Electronic components have become ubiquitous in modern society. The electronics industry routinely announces accelerated clocking speeds, higher transmission frequencies, and smaller integrated circuit modules. While the benefits of these devices are myriad, smaller electronic components that operate at higher frequencies also create problems. Higher operating frequencies mean shorter wavelengths, where shorter conductive elements within electronic circuitry may act as antennas to unintentionally broadcast electromagnetic emissions throughout the electromagnetic spectrum. If the signal strengths of the emissions are high enough, the emissions may interfere with the operation of an electronic component subjected to the emissions. Further, the Federal Communications Commission (FCC) and other regulatory agencies regulate these emissions, and as such, these emissions must be kept within regulatory requirements.

One way to reduce emissions is to form a shield around the modules. Typically, a shield is formed from a grounded conductive structure that covers a module or a portion thereof. When emissions from electronic components within the shield strike the interior surface of the shield, the electromagnetic emissions are electrically shorted through the grounded conductive structure that forms the shield, thereby reducing emissions. Likewise, when external emissions from outside the shield strike the exterior surface of the shield, a similar electrical short occurs, and the electronic components in the module do not experience the emissions.

If the electronic components in these modules are formed on a substrate, the conductive structure that forms the shield needs to be coupled to ground through the substrate. However, the miniaturization of the modules makes it increasingly difficult to couple the shields to the ground. Furthermore, shielding the inner layers within the substrate becomes more and more important as miniaturization allows a greater density of these modules to be placed within a given area. Thus, what is needed is a shield structure that is easily coupled to ground and which provides more shielding of the inner layers within the substrate.

SUMMARY

The present disclosure may be used to form one or more electronic modules with electromagnetic shields. In one embodiment, an electronic module is formed on a component portion of a substrate. To more easily attach the electromagnetic shield to ground, a plurality of metallic layers are provided that extend along a periphery of the component portion. These metallic layers are coupled to one another and may form a conductive path to ground.

The component portion may define a component area on a surface of the substrate. Electronic components are provided on the component area and an overmold may then be provided to cover the component areas. These metallic layers may be exposed through openings formed through at least the overmold. An electromagnetic shield may be formed in the opening and over the overmold by applying an electromagnetic shield material. Since the exposed metallic layer extends along the periphery of the component portion, the electromagnetic shield attaches to the exposed metallic layer and connects to ground. Openings may be formed to any of the metallic layers whether the metallic layers are on the surface of the substrate or within the substrate. As a result, inner layers of the substrate may be shielded by selecting the metallic layer exposed by the opening.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of this disclosure, and together with the description serve to explain the principles of this disclosure.

FIG. 1 is a cross sectional view of a first embodiment of an electronic module in accordance with this disclosure.

FIG. 7A-7L illustrates steps for forming the first embodiment of the electronic meta-module in FIG. 5.

DETAILED DESCRIPTION OF THE PREFERRED EMBODIMENTS

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

Figure 1:
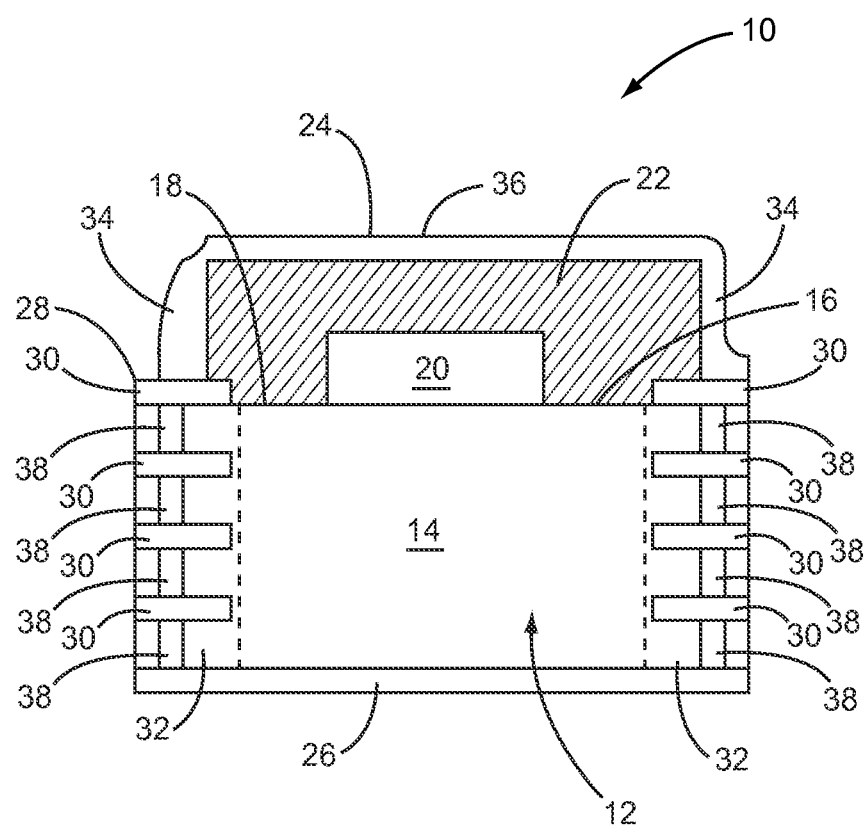
FIGS. 1A-1E illustrates steps for forming the first embodiment of the electronic module shown in FIG. 1.

The present disclosure relates to shielded electronic modules and methods of manufacturing electromagnetic shields in electronic modules. FIG. 1 illustrates one embodiment of an electronic module 10 manufactured in accordance with this disclosure. The electronic module 10 may be formed on a substrate 12. This substrate 12 may be made from any material(s) utilized to support electronic components. For example, substrate 12 may be formed from laminates such as FR-1, FR-2, FR-3, FR-4, FR-5, FR-6, CEM-1, CEM-2, CEM-3, CEM-4, CEM-5, and the like. Substrate 12 may also be formed from ceramics and/or alumina.

The substrate 12 has a component portion 14 for the electronic module 10. In the illustrated embodiment, the component portion 14 is simply the portion of the substrate 12 that supports the structures of the electronic module 10. Thus, the component portion 14 may take up the entire substrate 12 or may take up only a particular portion of the substrate 12. The component portion 14 includes a component area 16 on a surface 18 of the substrate 12 and one or more electronic components 20 formed on the component area 16. Also, structures (not shown) that form part of or are coupled to the electronic components 20 may be formed within the component portion 14. In addition, the component portion 14 may include conductive paths (not shown) that form internal and external connections to and from the electronic module 10.

The electronic components 20 may be any type of electronic component. For example, electronic components 20 may be an electronic circuit built on its own semiconductor substrate, such as a processor, volatile memory, non-volatile memory, a radio frequency circuit, or a micro-mechanical system (MEMS) device. Electronic components 20 may also be electrical devices such as filters, capacitors, inductors, and resistors or electronic circuits having any combination of these electronic devices.

To protect the electronic components 20 from both internal and external electromagnetic emissions, an overmold 22 and electromagnetic shield 24 are formed over the component area 16 to cover the electronic components 20. The overmold 22 may be utilized to isolate the electronic components 20 and may be made from insulating or dielectric materials. To couple the electromagnetic shield 24 to a ground plate 26 below the substrate 12, a metallic structure 28 is provided that extends through the component portion 14 and is attached to the electromagnetic shield 24. The metallic structure 28 includes a plurality of metallic layers 30 which in this embodiment are stacked over one another. The metallic layers 30 extend along a periphery 32 of the component portion 14. The periphery 32 (or a perimeter) may be any boundary line, area, or volume that defines a boundary of the component portion 14. Furthermore, the metallic layers 30 may extend along or about the periphery 32 by being within, adjacent to, close to, or by defining the periphery 32 of the component portion 14 itself. As is explained below, in the illustrated example, the periphery 32 of the component portion 14 is defined by the metallic layers 30 and the metallic layers 30 surround the entire periphery of the component portion 14. In some embodiments, the metallic layers 30 extend about only a portion of the periphery 32 and thus may not define the periphery 32 of the component portion 14. However, as shall be explained in further detail below, the metallic layers 30 in this embodiment extend along the entire periphery 32 so that each circumscribes a cross-section of the component portion 14.

In this embodiment, the electromagnetic shield 24 is attached to the metallic layer 30 on the surface 18 of the substrate 12 that extends along a perimeter of the component area 16. The other metallic layers 30 are within the substrate 12 and below the metallic layer 30 on the surface 18 of the substrate 12. However, as shall be explained in further detail below, the electromagnetic shield 24 may attach to any of the plurality of metallic layers 30. Since the metallic layers 30 extend along the periphery 32 of the component portion 14, the metallic layers 30 make it easier to attach the electromagnetic shield 24 to the ground plate 26. The electromagnetic shield 24 may include lateral portions 34 and a top portion 36. The lateral portions 34 extend downward to connect to the metallic layers 30. The plurality of metallic layers 30 are coupled to one another utilizing conductive vertical interconnect access structures ("vias") 38. The conductive vias 38 may be any type of structure that connects electronic elements on different vertical levels of a substrate 12. For example, conductive vias 38 may be formed as plated through-holes, conductive pillars, conductive bars, and the like.

Figure 1A:
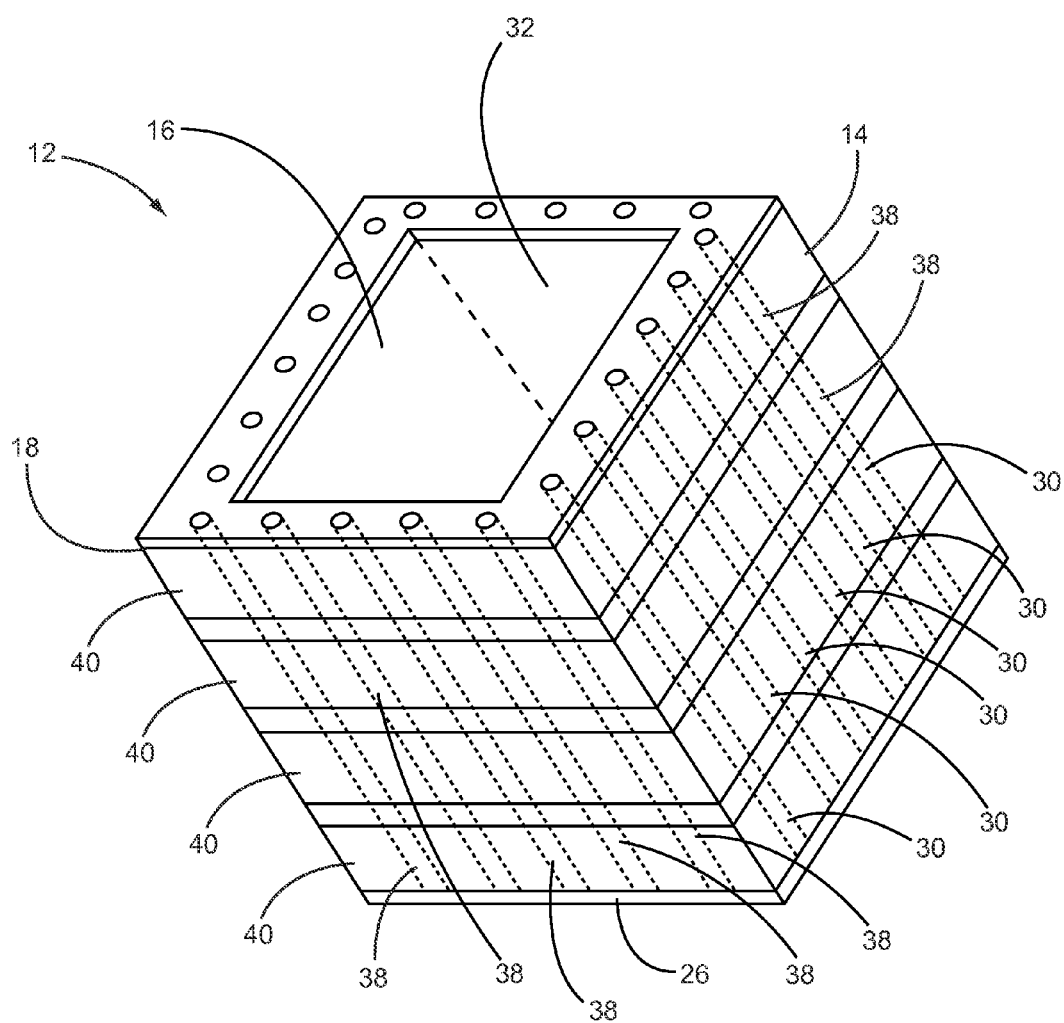
Figure 1B:
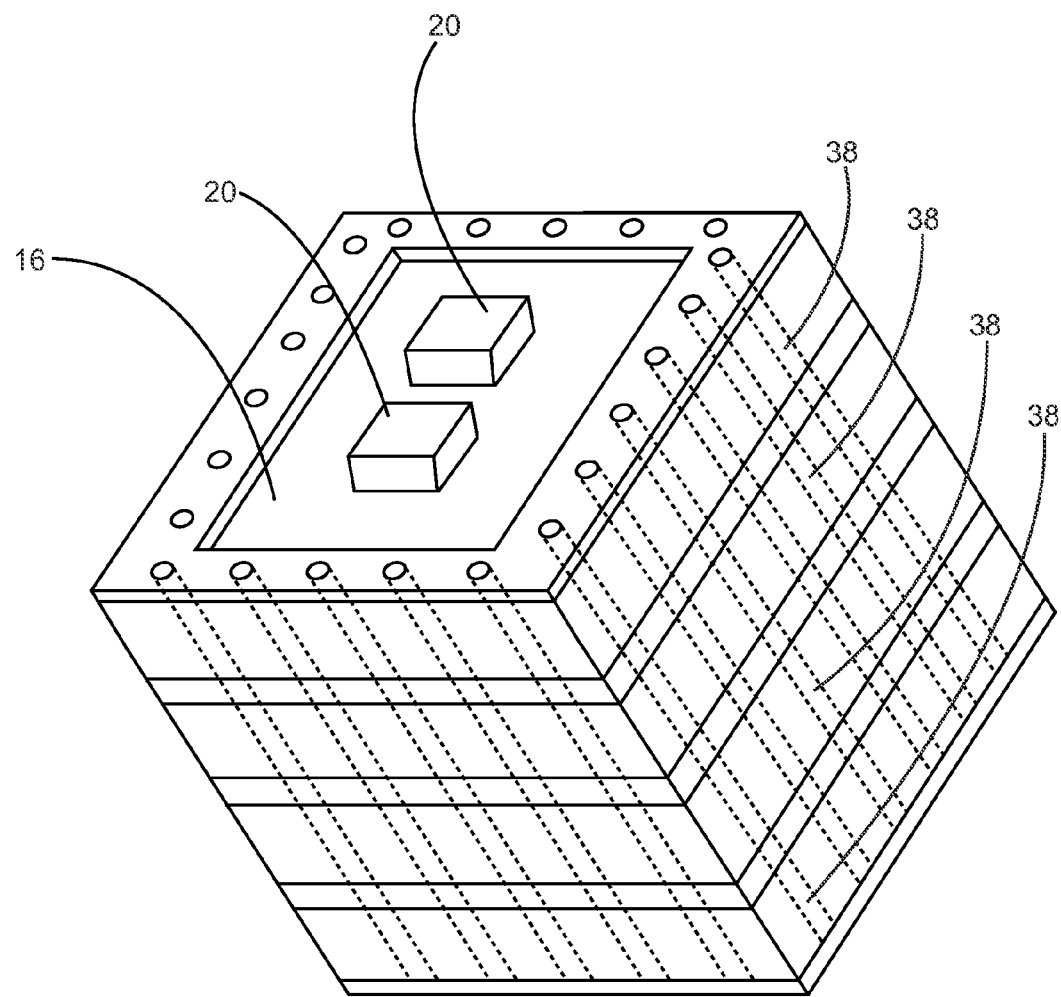

FIGS. 1A-1E illustrates a series of steps for manufacturing the electronic module 10 illustrated in FIG. 1. It should be noted that the ordering of these steps is simply illustrative and the steps may be performed in a different order. Furthermore, the steps are not meant to be exhaustive and other steps and different steps may be utilized to manufacture the electronic module 10, as shall be recognized by those of ordinary skill in the art. The same is true for other steps described in the Figures of this disclosure. First, the substrate 12 is provided (FIG. 1A). The substrate 12 may be formed from vertically stacked insulation layers 40 that make up the body of the component portion 14. The vertically stacked insulation layers 40 may be formed from one or more dielectric or insulating materials. In this embodiment, the component portion 14 has been formed over the ground plate 26. On top of the surface 18 of the component portion 14 and between the vertically stacked insulation layers 40 of the component portion 14 are the metallic layers 30 of the metallic structure 28. In this embodiment, the metallic layers 30 extend about the entire periphery 32 of the component portion 14 to circumscribe a cross-sectional area of the component portion 14. For example, the top metallic layer 30 on the surface 18 of the component portion 14 surrounds a perimeter of the component area 16. Substrate 12 may include additional layers above, below, and between vertically stacked insulation layers 40 and metallic layers 30 depending on the application for the electronic module 10.

Between each of the metallic layers 30, the plurality of conductive vias 38 are positioned between the metallic layers 30. The conductive vias 38 may be utilized to form a conductive path to the ground plate 26. In other embodiments, conductive vias 38 may be utilized to form conductive paths for internal or external connections. For example, a ground node may physically be distant from the electronic module 10 and thus conductive vias 38 may be utilized to form a path to an external connection that couples the metallic structure 28 to the ground node.

The metallic layers 30 and conductive vias 38 also provide shielding for the vertically stacked insulation layers 40 within the component portion 14 of the substrate 12. As explained above, metallic layers 30 surround the periphery 32 of the component portion 14 thereby circumventing a cross-section of the component portion 14. A set of the plurality of conductive vias 38 between each of the metallic layers 30 substantially surround the perimeter 32 to circumvent the portions of the periphery 32 between the metallic layers 30. These conductive vias 38 are discrete from one another and thus do not fully surround the periphery 32 of the component portion 14. Consequently, gaps between the conductive vias 38 are exposed. However, conductive vias 38 may be provided close enough to one another so as to present an electromagnetic barrier to electromagnetic emissions. The metallic layers 30 may be made from any type of metal such as, for example, copper (Cu), gold (Au), silver (Ag), Nickel (Ni). The metallic material may also include metallic alloys and other metallic materials mixed with or forming ionic or covalent bonds with other non-metallic materials to provide a desired material property.

Figure 1C:
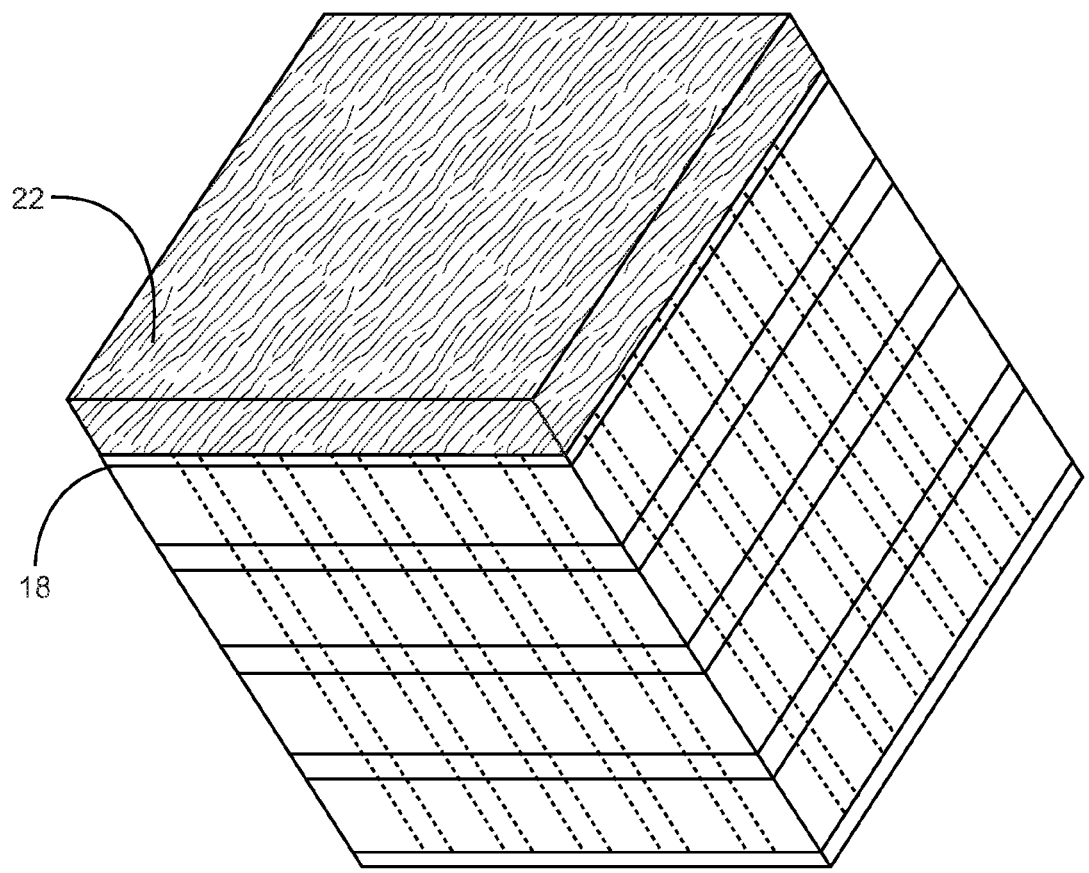
Figure 1D:
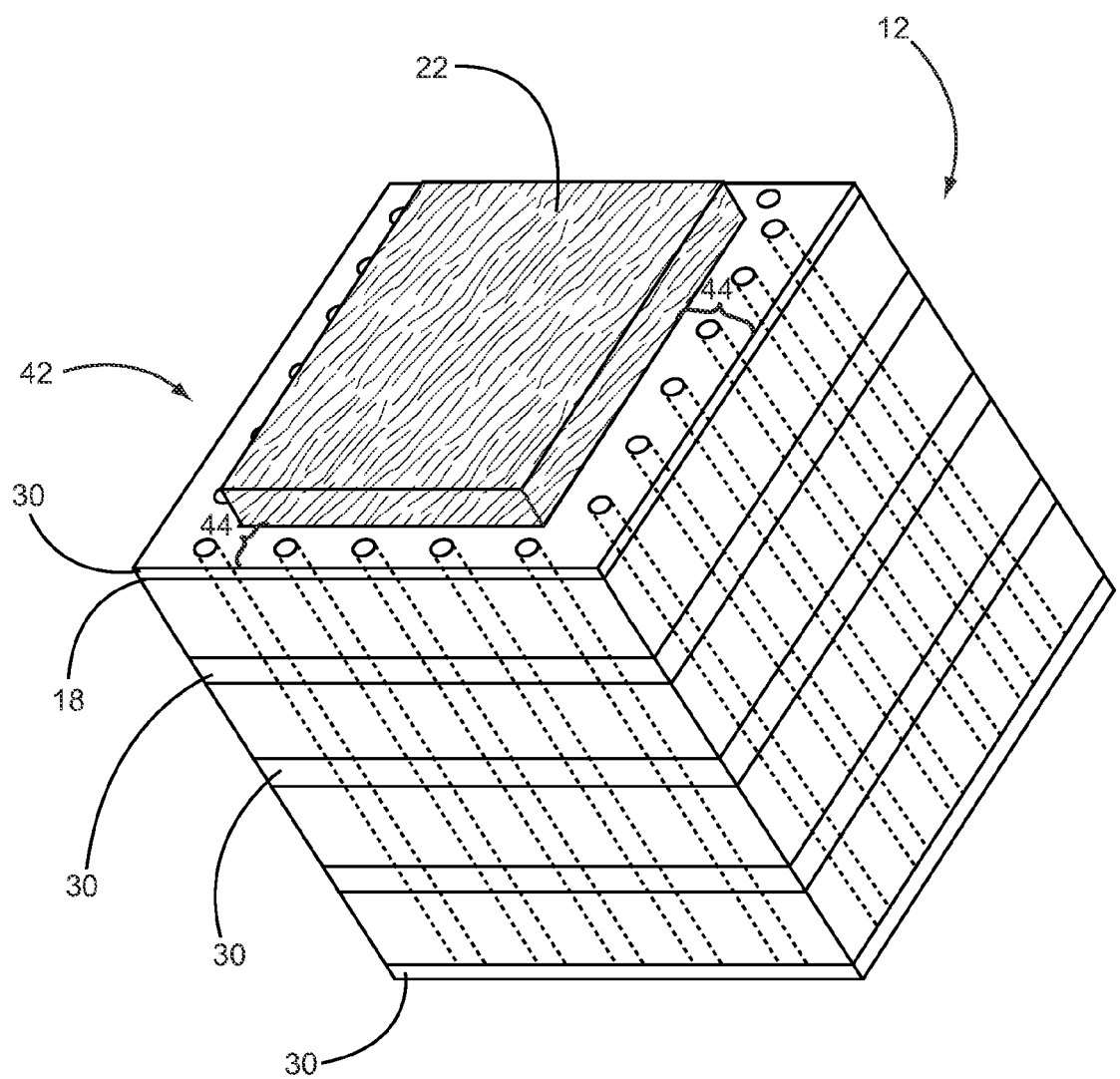
Figure 1E:
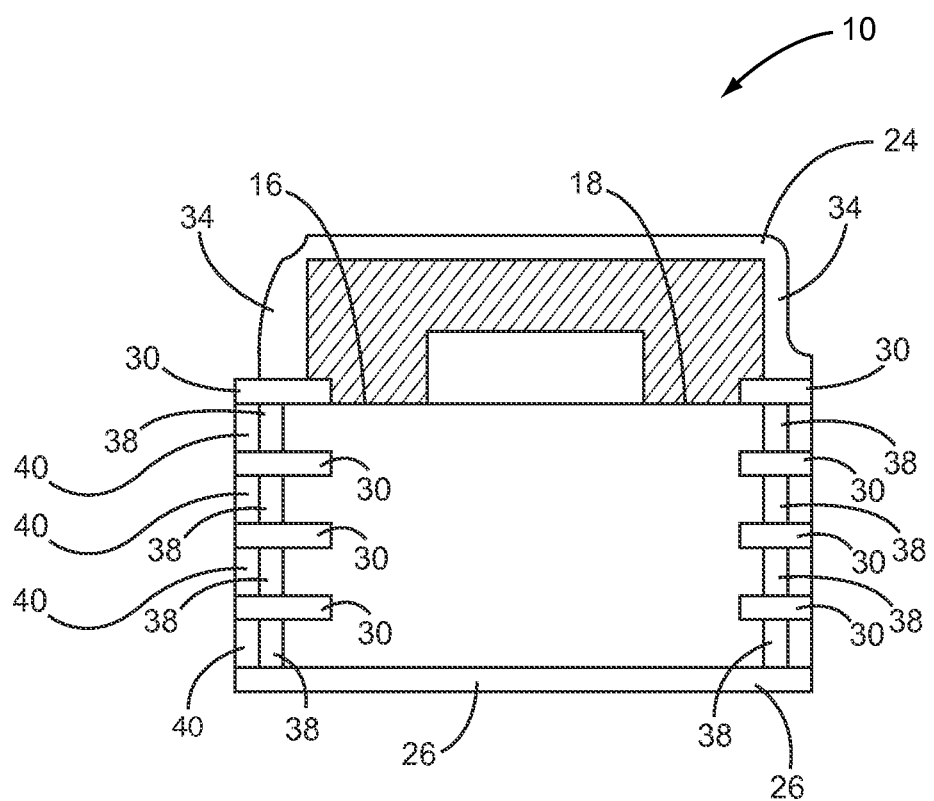

Next, electronic components 20 may be provided on the component area 16 (FIG. 1B) and the overmold 22 is provided over the surface 18 to cover the component area 16 (FIG. 1C). In this embodiment, an opening 42 is formed through the overmold 22 to expose a section 44 of the top metallic layer 30 on the surface 18 of the substrate 12 (FIG. 1D). A seed layer (not shown) may then be provided over the overmold 22 and the section 44. Next, an electromagnetic shield material may then be applied onto the seed layer by, for example, an electrolytic or electroless plating process so that the electromagnetic shield material builds on the section 44 within the opening 42 and over the overmold 22. This forms the electromagnetic shield 24 over the component area 16 and the electromagnetic shield 24 is coupled to the section 44 of the metallic layer 30 on the surface 18 of the substrate 12 (FIG. 1E).

Figure 2:
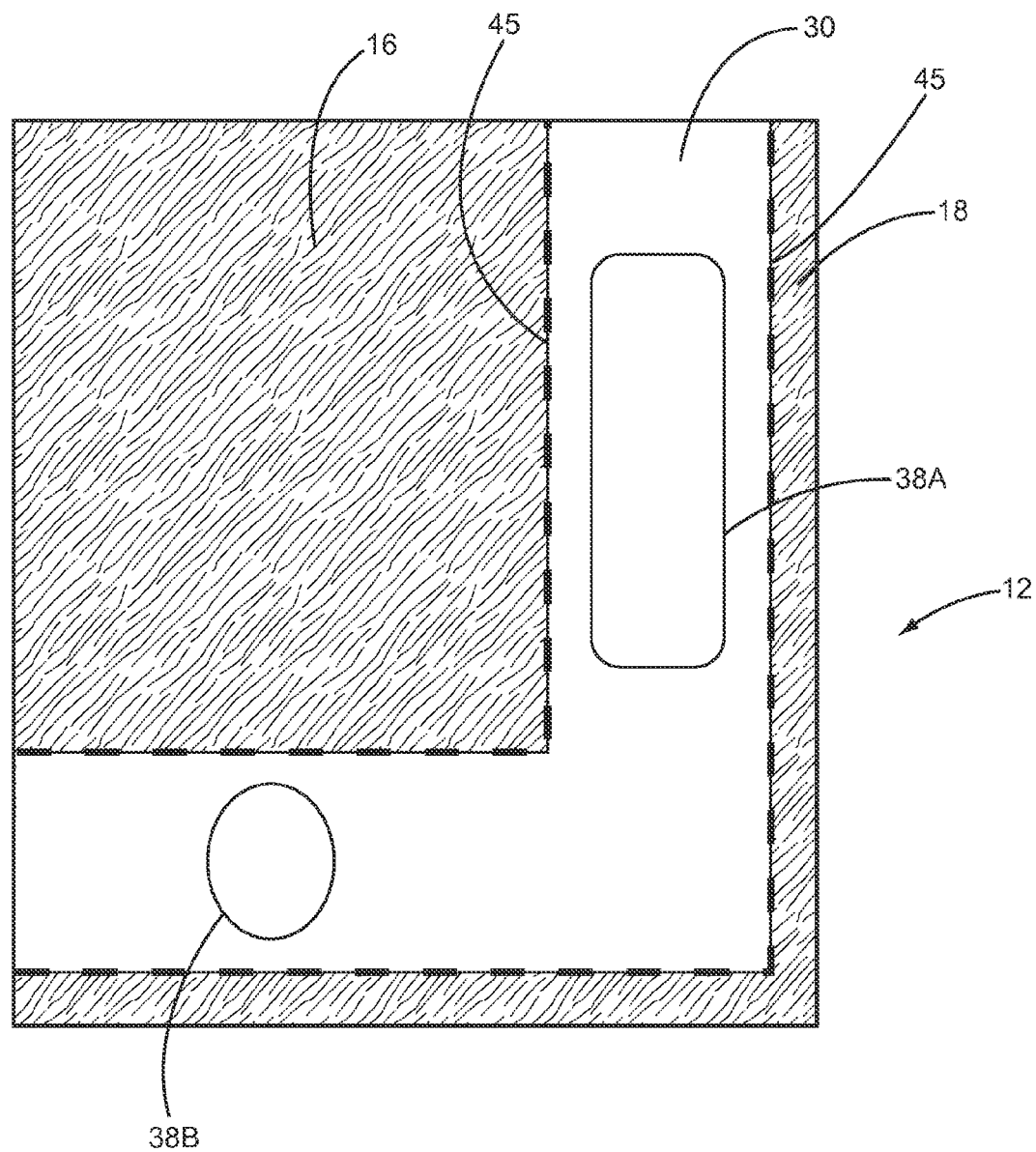
FIG. 2 illustrates one embodiment of a metallic layer along a perimeter of the component area of a substrate.

FIG. 2 illustrates a top view of a portion of the top metallic layer 30 on the surface 18 of the substrate 12. As explained above, the top metallic layer 30 may extend along a perimeter 45 of the component area 16. The conductive vias 38 (shown in FIG. 1A) may be formed to couple and/or be integrated with the metallic layers 30. Conductive vias 38 may have any shape. FIG. 2 illustrates projections 38A, 38B of two conductive vias 38 within the substrate 12 beneath the top metallic layer 30. In this particular embodiment, the conductive vias 38 are solid metal bars and the projection 38A is of a circular shaped conductive metal bar and projection 38B is of a slot shaped conductive metal bar. These conductive vias may be made from any type of conductive material such as metals like, for example, copper (Cu), gold (Au), silver (Ag), Nickel (Ni). The conductive material may also include metallic alloys and other conductive materials mixed with or forming ionic or non-covalent bonds with other non-conductive materials to provide a desired material property.

Figure 3A:
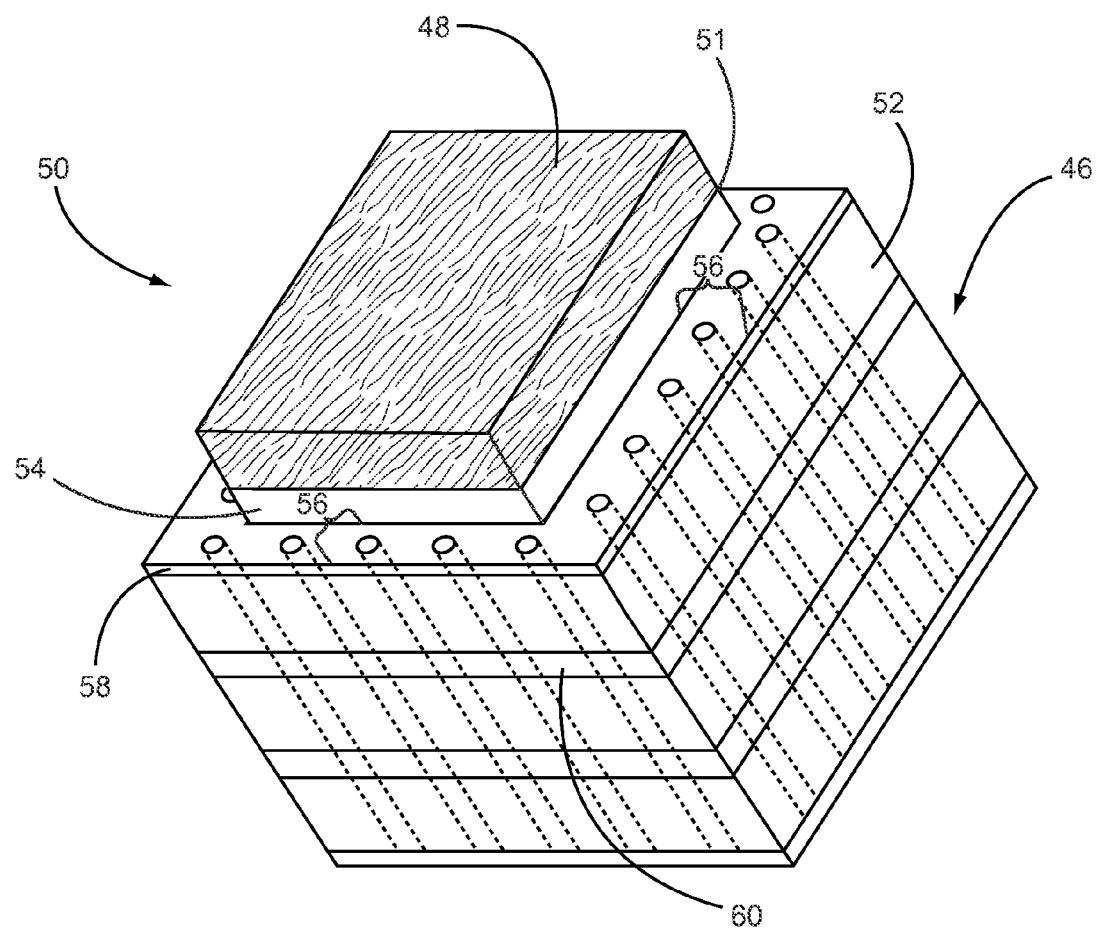
FIG. 3A-3C illustrates steps for forming a second embodiment of an electronic module in accordance with this disclosure.
Figure 3B:
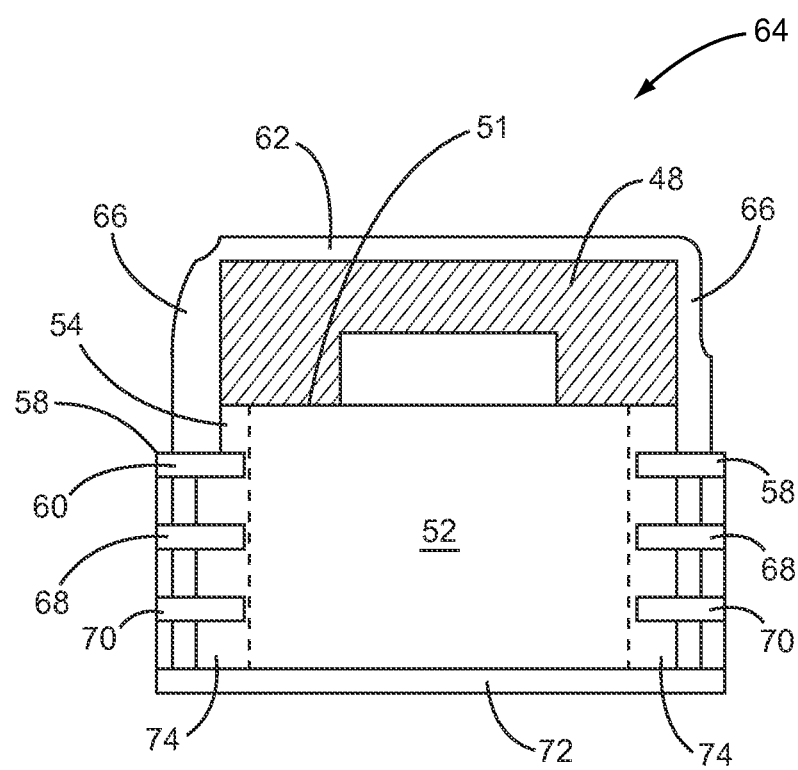

FIGS. 3A and 3B illustrates steps for manufacturing another embodiment of an electronic module. In FIG. 3A, a substrate 46 and an overmold 48 are provided utilizing essentially the same steps as described above in FIGS. 1A-1D. However, in this embodiment, an opening 50 along the periphery 32 of a component portion 52 is not only formed through the overmold 48 but also through the top metallic layer (not shown) that once surrounded the component area 51 and the first vertically stacked insulation layer 54 of the component portion 52. This exposes a section 56 of a first metallic layer 58 in a metallic structure 60 which once was within the component portion 52 prior to forming the opening 50.

An electromagnetic shield material may then be applied over the overmold 48 and the section 56 of the first metallic layer 58 to form an electromagnetic shield 62 (FIG. 3B). In this embodiment of an electronic module 64, the electromagnetic shield 62 is attached to the first metallic layer 58 of the metallic structure 60. Consequently, lateral portions 66 of the electromagnetic shield 62 are formed to shield the first vertically stacked insulation layer 54 of the component portion 52, thus providing shielding to internal portions of the substrate 46. The metallic structure 60 includes a second metallic layer 68 below the first metallic layer 58 and a third metallic layer 70. Furthermore, the ground plate of this embodiment forms another metallic layer 72 in the metallic structure 60. The opening 50 (illustrated in FIG. 3A) may be formed to expose any of these metallic layers 58, 68, 70, 72. In this manner, the depth of the lateral portions 66 can be controlled so that the electromagnetic shield 62 attaches to any of metallic layers 58, 68, 70, 72 that are below the component area 51. This can also be utilized to determine the degree to which the electromagnetic shield 62 shields a periphery 74 within the component portion 52. In the electronic module 64, the lateral portions 66 of the electromagnetic shield 62 surround the first vertically stacked insulation layer 54 to provide shielding.

It should be noted that a grinding process may be utilized to form the opening 50 (shown in FIG. 3A). The grinding process may expose any of the metallic layers 58, 68, 70, 72 below the component area 51 but may not entirely remove the metallic layers 58, 68, 70, 72 above the exposed metallic layer, which in this example is the first metallic layer 58. Portions of the top metallic layer (not shown) that once was above the first metallic layer 58 may remain after grinding. In this case, the electromagnetic shield 62 may be coupled to both the top metallic layer and the first metallic layer 58.

Figure 3C:
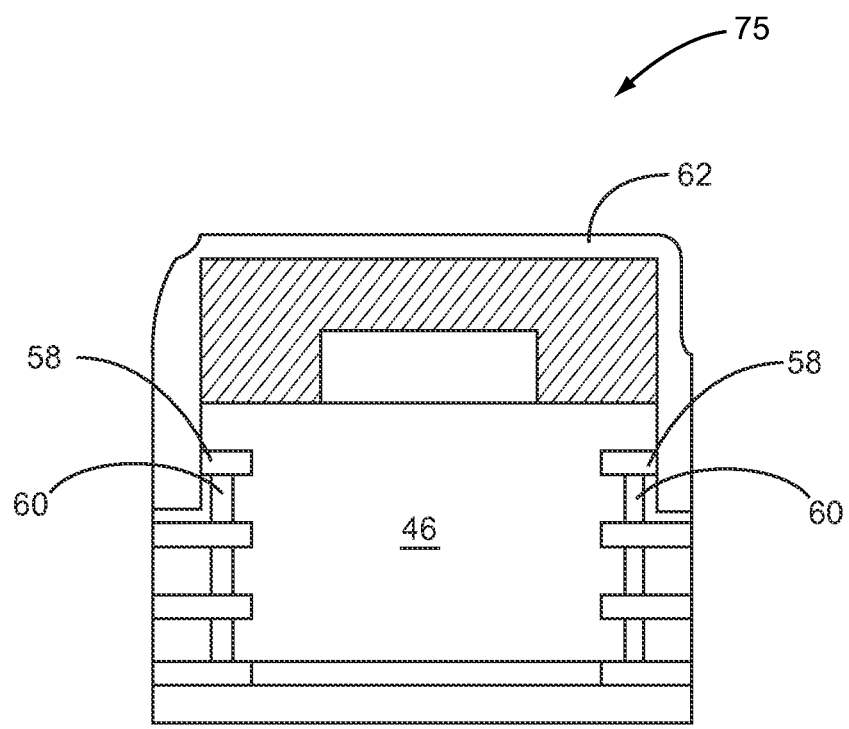

FIG. 3C illustrates another embodiment of an electronic module 75 formed from the same substrate 46 illustrated in FIG. 3A. The electromagnetic shield 62 may be coupled to any portion of any of the metallic layers 58, 68, 70, 72. In this embodiment, the opening 50 exposes the side section of the first metallic layer 58 and the electromagnetic shield 62 is coupled to this side section.

Figure 4A:
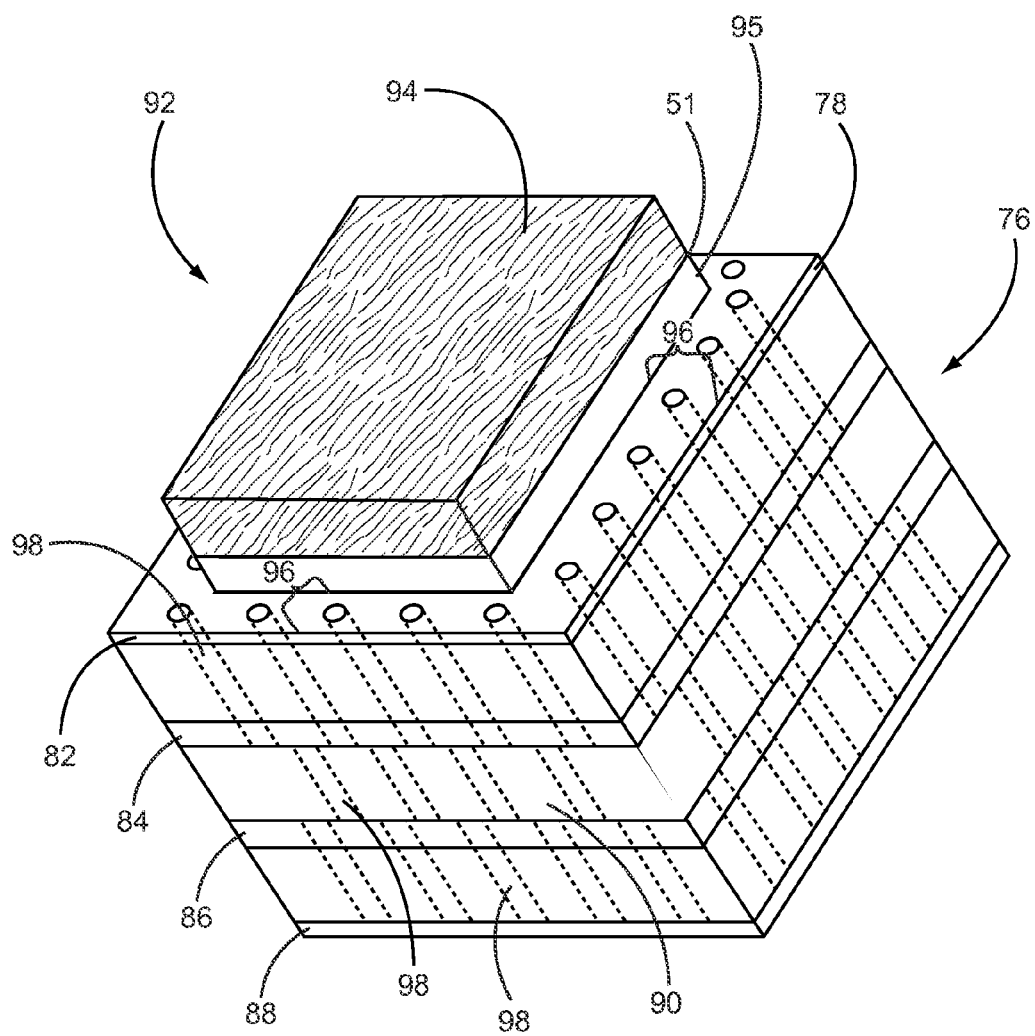
FIGS. 4A and 4B illustrates steps for forming a third embodiment of the electronic module in accordance with this disclosure.
Figure 4B:
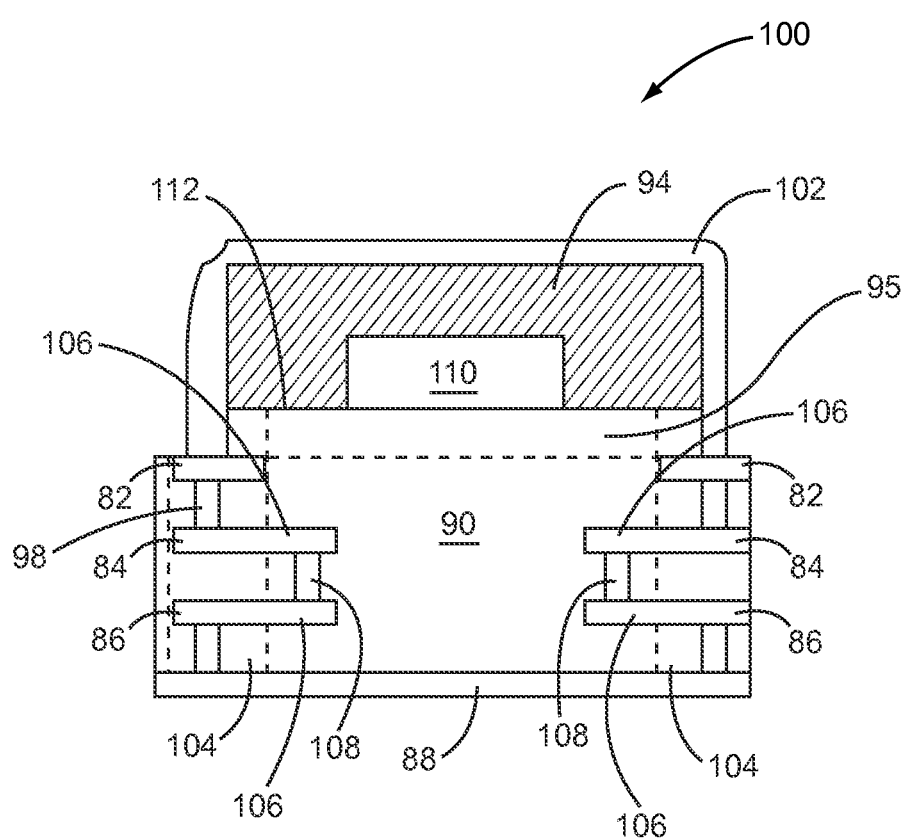

Next, FIGS. 4A and 4B illustrate steps for manufacturing yet another embodiment of an electronic module. In FIG. 4A, substrate 76 has a metallic structure 78 with first, second, third, and fourth metallic layers 82, 84, 86, 88 in a component portion 90. As in the previous embodiment, an opening 92 has been formed through an overmold 94, a top metallic layer (not shown), and a first vertically stacked substrate layer 95 of the component portion 90 to expose a section 96 of the first metallic layer 82. Also, the metallic structure 78 includes a plurality of conductive vias 98 which are provided between each of the metallic layers 82, 84, 86, 88 to couple the metallic layers 82, 84, 86 to the fourth metallic layer 88 which in this embodiment is a ground plate. However, the plurality of conductive vias 98 between the second and third metallic layers 84, 86 are not aligned with the plurality of conductive vias 98 between the first and second metallic layers 82, 84 and the third and fourth metallic layers 86, 88.

FIG. 4B illustrates a cross-sectional view of an electronic module 100 after a electromagnetic shield 101 is formed over the overmold 102 and the section 96 (shown in FIG. 4A) of the first metallic layer 82. The conductive vias 98 along a periphery 104 of the component portion 90 between the second and third metallic layers 84, 86 which were illustrated in FIG. 4A are not illustrated in FIG. 4B because these conductive vias 98 are not aligned with the conductive vias 98 along the periphery 104 with the conductive vias 98 between the first and second metallic layers 82, 84 and the third and fourth metallic layers 86, 88.

In this embodiment, the second and third metallic layers 84, 86 each include an extended portion 106 that extends from the perimeter 104 and into the component portion 90. The extended portions 106 on the second metallic layer 84 are coupled to the extended portion 106 of the third metallic layer 86 by conductive vias 108. These extended portions 106 may be utilized to connect to an electronic component 110 on a component area 112. In another embodiment, the opening 92 (shown in FIG. 4A) may be formed to expose the second metallic layer 84 so that the electromagnetic shield 101 is attached to the second metallic layer 84 which may be coupled to the electronic component 110. Also, in this manner, metallic layers 82, 84, 86, 88 may form internal connections between each other or to parts of the electronic module 100 within the component portion 90.

Figure 5:
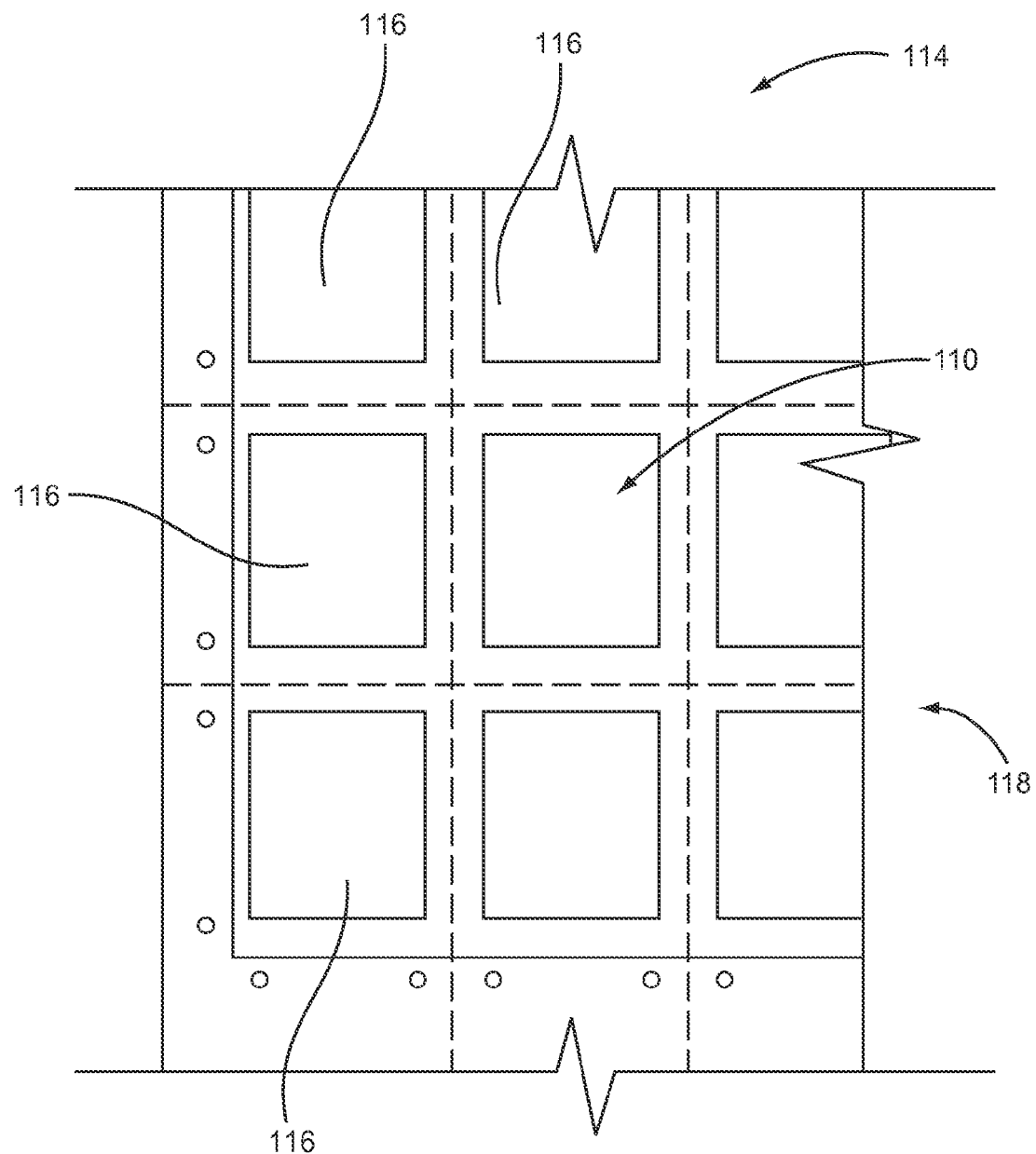
FIG. 5 illustrates one embodiment of a first embodiment of meta-module having a first array of electronic modules.
Figure 6:
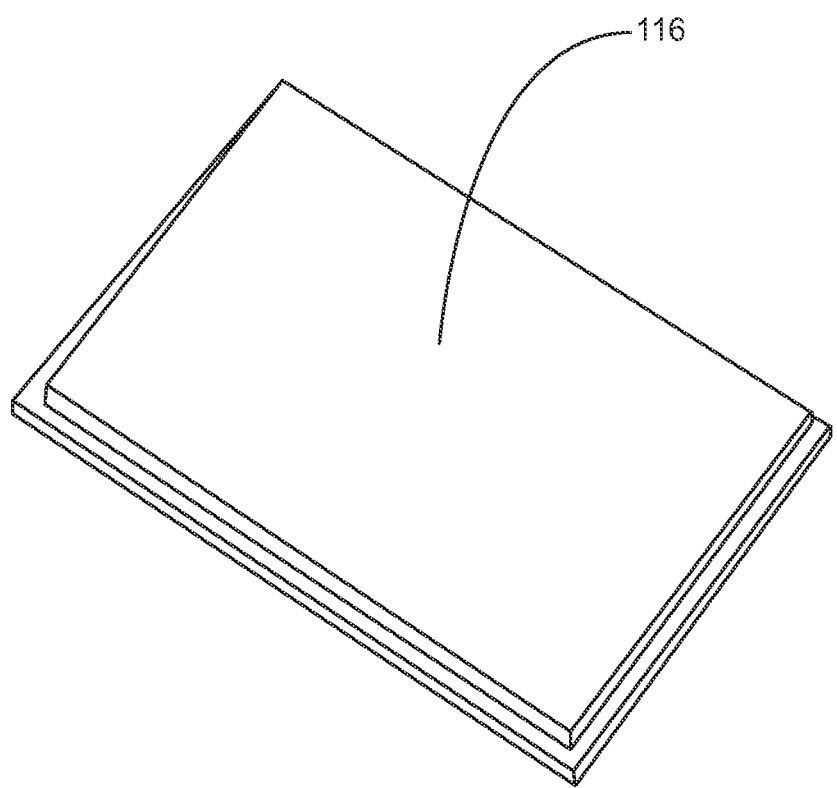
FIG. 6 is a perspective view of one of the electronic modules from the first array of electronic modules in FIG. 5 after the electronic module has been singulated from the first embodiment of the meta-module.

Referring now to FIG. 5, one embodiment of an electronic meta-module 114 having a plurality of shielded electronic modules 116 is shown. In this example, the plurality of modules 116 is arranged as an array 118 of modules 116. The array 118 may be of any shape, however, in this example, the array 118 is a rectangular array that arranges the plurality of modules 116 in rows and columns. As shown in FIG. 6, these shielded electronic modules 116 may be singulated from the electronic meta-module 114 to provide individual shielded electronic modules 116.

Figure 7A:
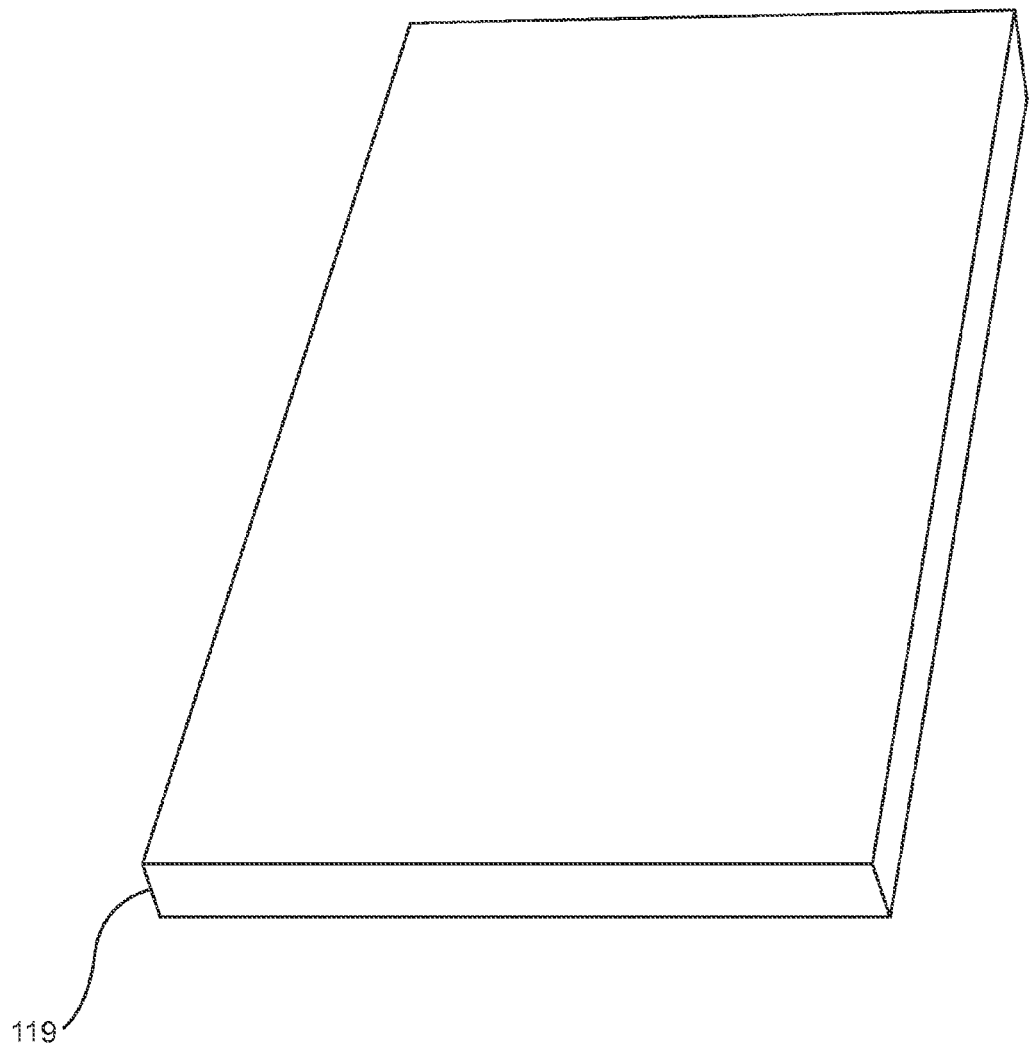
Figure 7B:
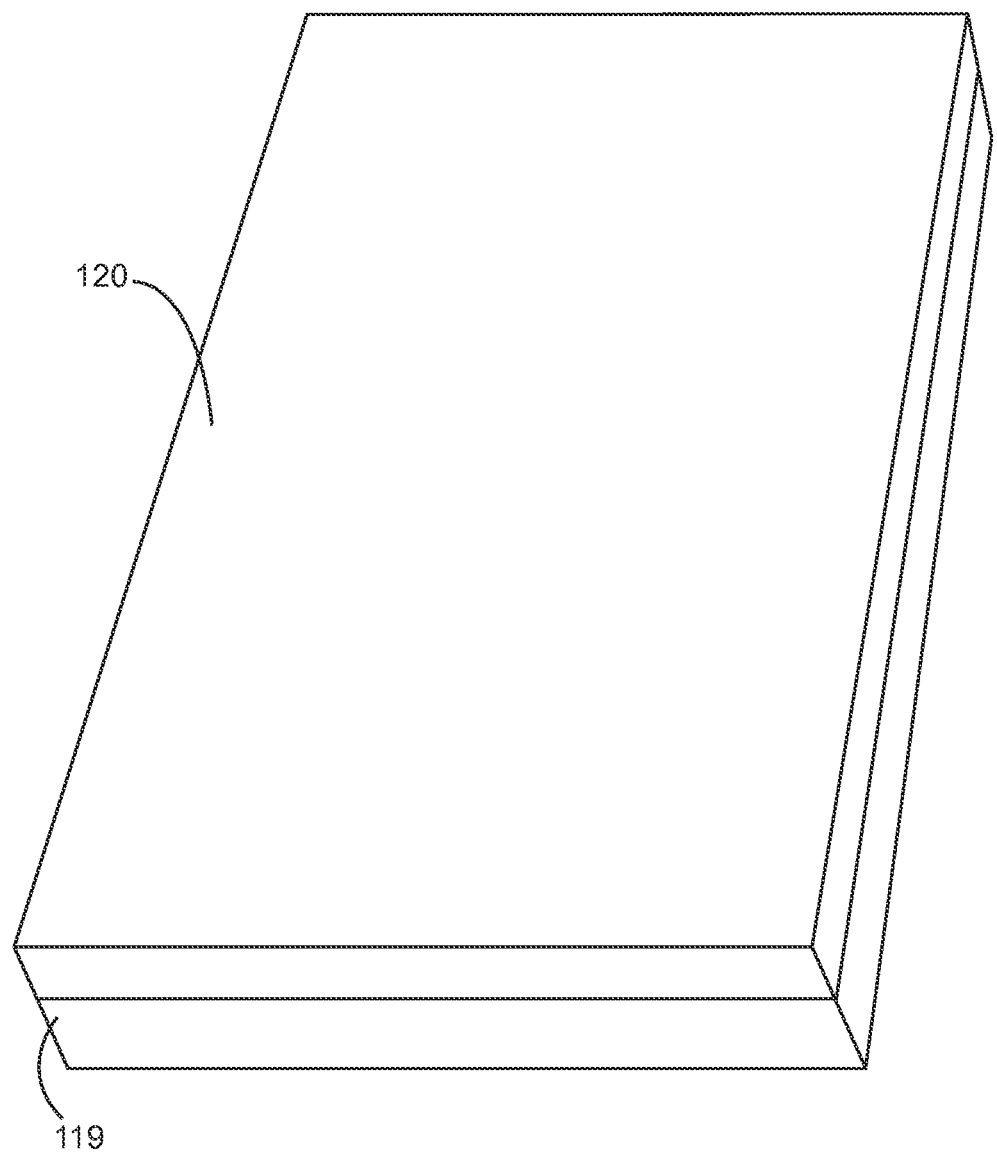
Figure 7C:
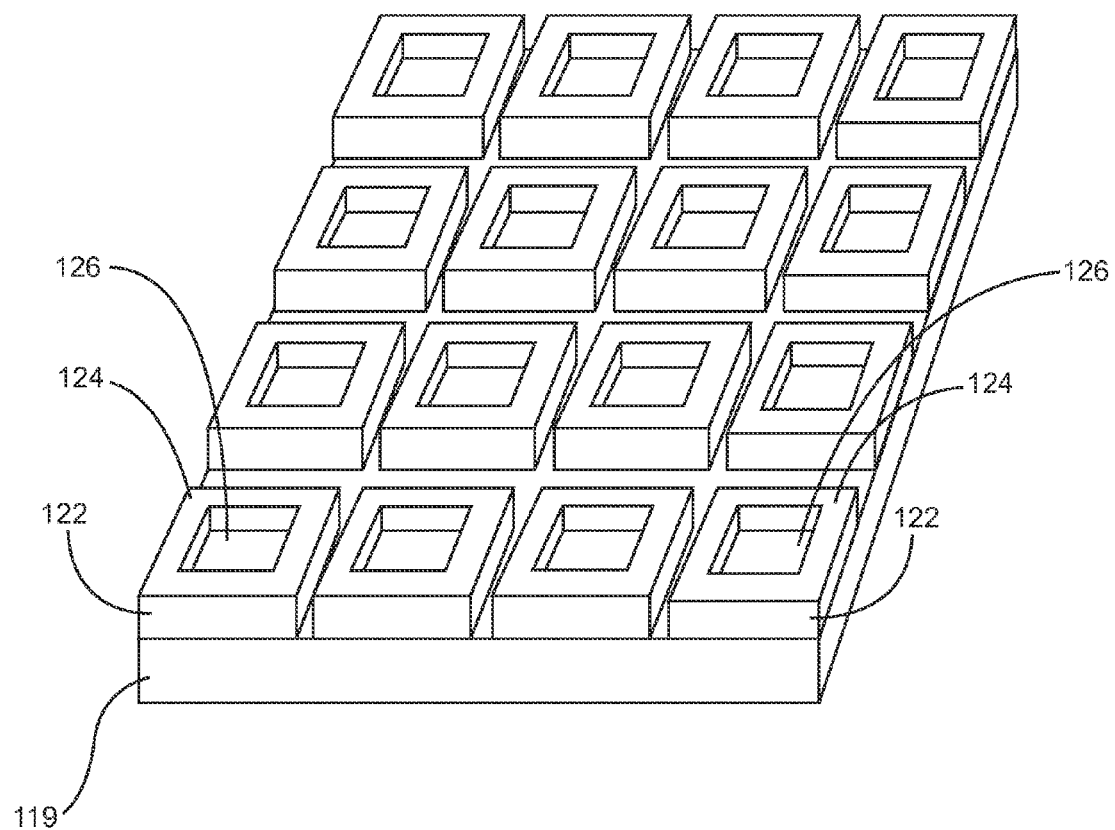

FIGS. 7A-7L illustrates a series of steps for manufacturing the electronic meta-module 116. To create a substrate for the electronic meta-module 116, a carrier metallic layer 119 is first provided (FIG. 7A) and a first metallic sheet 120 is formed on the carrier metallic layer 119 (FIG. 7B). Photo lithography may be utilized to form the first metallic sheet 120 into a first metallic layer 122 of a plurality of metallic structures 124 (FIG. 7C). Photo lithography may also be utilized to form circuitry (not shown) from the first metallic sheet 120. This circuitry may form part of the first metallic layers 122, be within the first metallic layers 122, couple to the first metallic layers 122, and/or form structures that are not part of the first metallic layers 122. In this embodiment, the first metallic layers 122 are separated from one another because the plurality of metallic structures 124 are to be built as separated structures. Also, each of these first metallic layers 122 surrounds an aperture 126 which may include the circuitry discussed above (not shown). In other embodiments, the first metallic layers 122 may be a metallic strip and thus would not define the aperture 126.

Figure 7D:
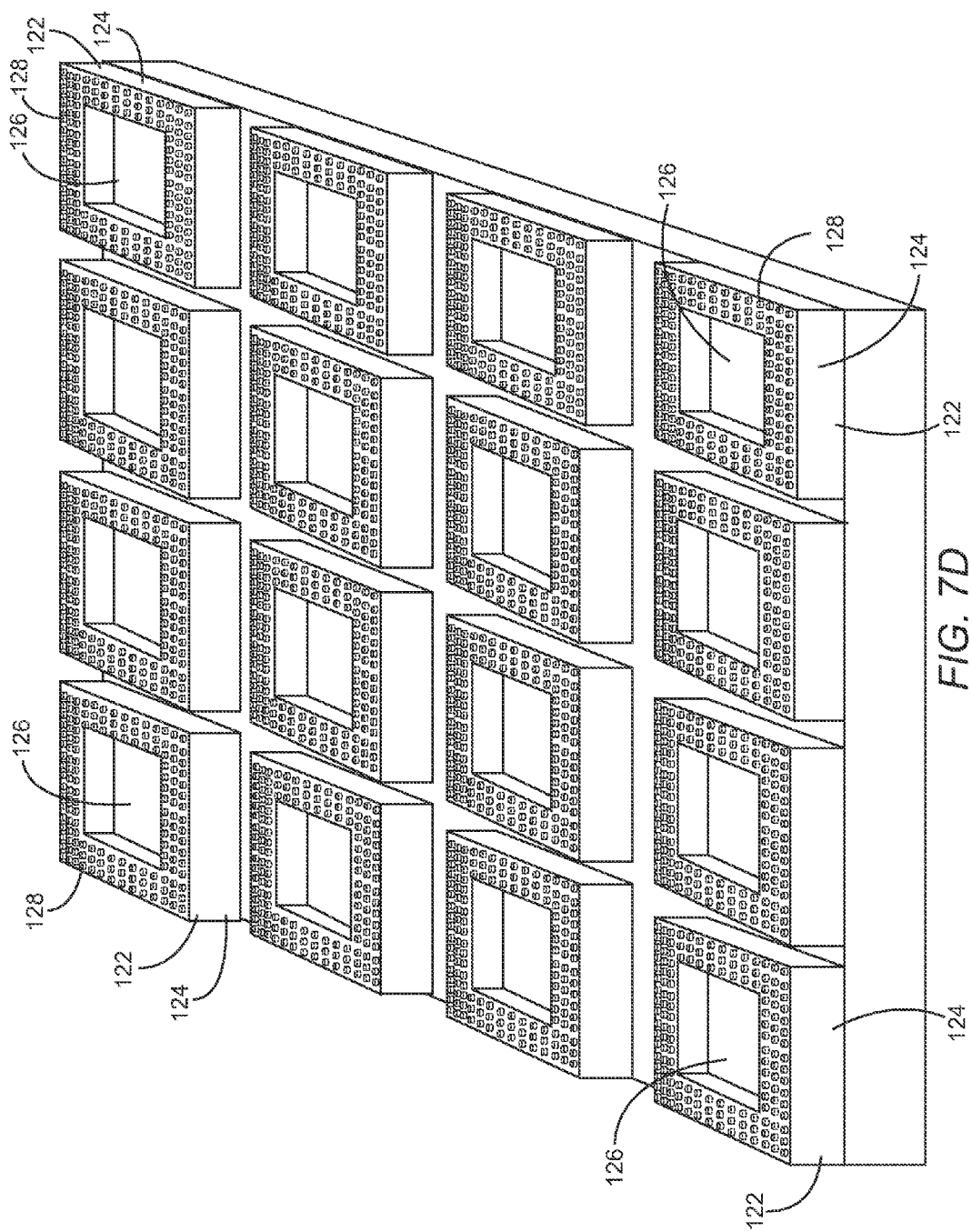
Figure 7E:
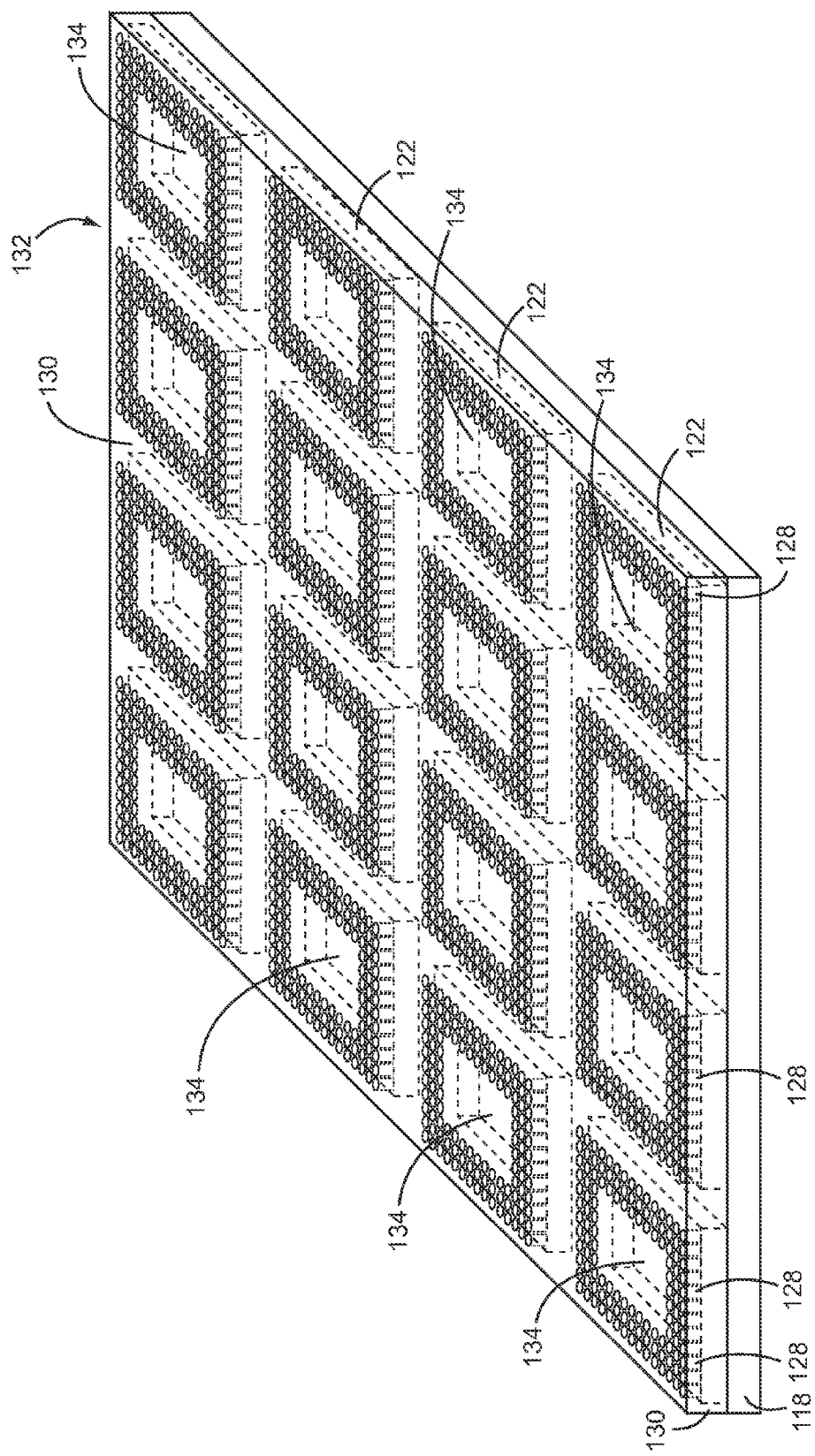
Figure 7G:
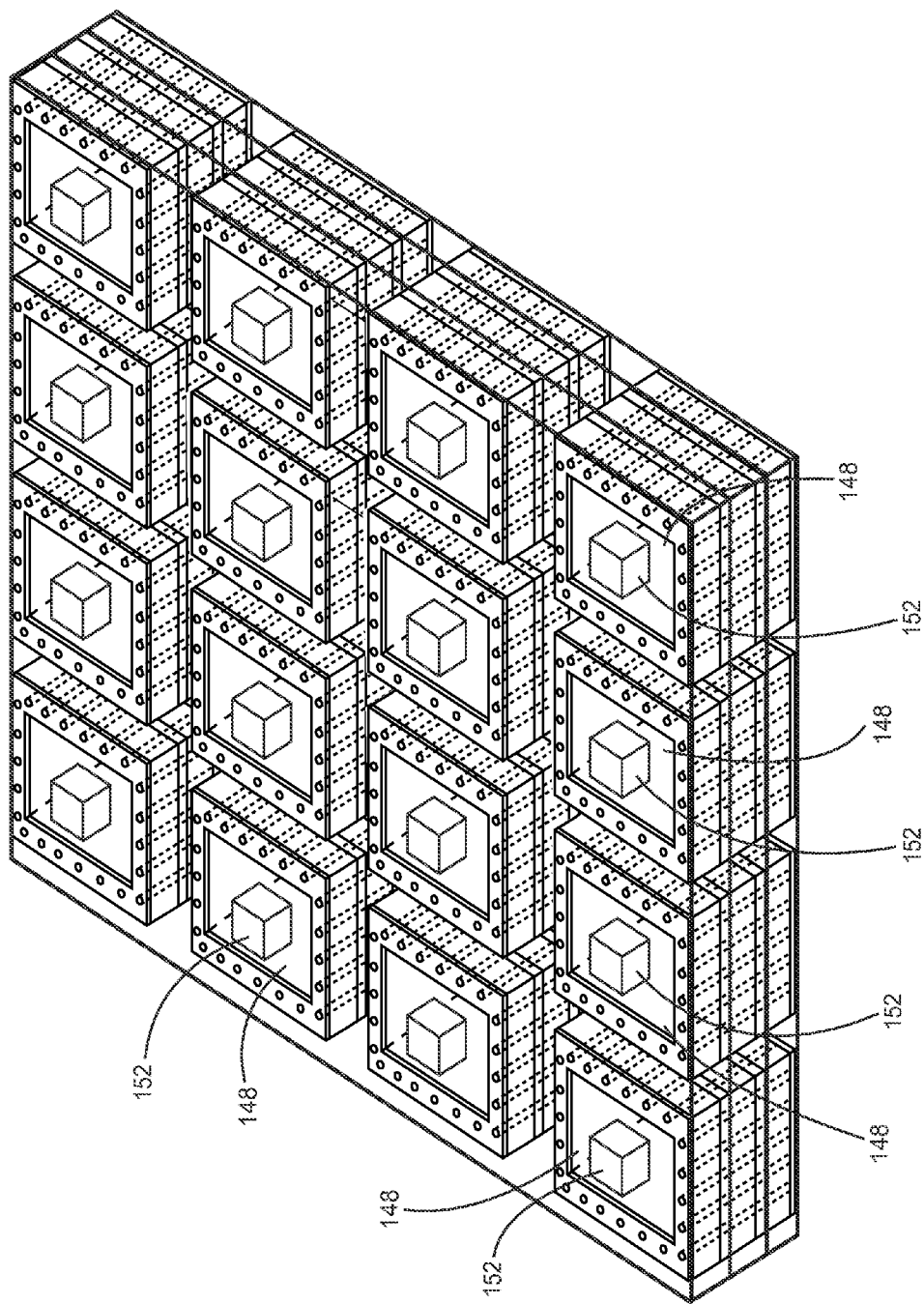

A first set of conductive vias 128 may then be formed on each of the first metallic layers 122 of the plurality of metallic structures 124 (FIG. 7D). In this embodiment, the conductive vias 128 are provided in rows of three (3) to form an array of conductive vias 128 around each of the first metallic layers 122. A first substrate layer 130 (FIG. 7E) may then be provided over the first metallic layers 122, the first set of conductive vias 128, and within the apertures 126 (shown in FIG. 7D). The first substrate layer 130 may be formed from a dielectric material that is laminated over the first metallic layers 122 and the conductive vias 128. When the first substrate layer 130 is initially provided over the first metallic layers 122, the first set of conductive vias 128 may extend above the first substrate layer 130. Thus, conductive vias 128 may be grinded so that the conductive vias 128 are flushed with the first substrate layer 130. The first substrate layer 130 forms a part of the substrate body 132 of the substrate.

In the illustrated embodiment, the conductive vias 128 are formed on the first metallic layers 122 prior to providing the first substrate layer 130. In the alternative, the first substrate layer 130 may be provided prior to forming the conductive vias 128. Afterwards, holes may be etched into the first substrate layer 130 and a conductive material plated into these holes to form the conductive vias 128.

When the first substrate layer 130 is provided, each of the apertures 126 (shown in FIG. 7D) enclosed by the first metallic layers 122 are filled with substrate material and each of the first metallic layers 122 surrounds an area 134 that forms part of a component portion of the substrate body 132. Thus, in the illustrated embodiment, the first metallic layer 122 circumscribes the area 134 of the first substrate layer 130 within the substrate body 132 which may define a section of the periphery of the component portion. The carrier metallic layer 119 may be removed and the process described in FIGS. 7A-7E may be repeated to form the desired number of additional substrate layers 136, 138 in the substrate body 132 of the substrate 133 and additional metallic layers 140, 142, 144 of the metallic structures 124 for each component portion 146 (FIG. 7F). The substrate 133 is depicted as having second, third, and fourth metallic layers, 140, 142, 144 formed over of the first metallic layer 122. Similarly, the second and third substrate layers 136, 138 are formed over the first substrate layer 130. It should be noted however that the substrate 133 does not necessarily have to be formed from the bottom to the top. The substrate 133 could be provided from the top to the bottom where the third substrate layer 138 and third and fourth metallic layers 142, 144 are formed first. In addition, substrate 133 may be built from the middle outwards where first metallic layer 122 and first substrate layer 130 are one of the middle layers of the substrate body 132. The second, third, and fourth metallic layers 140, 142, 144 and second and third substrate layers 136, 138 would be formed on either side of the first metallic layer 122 and first substrate layer 130 to form the substrate 133.

Figure 7H:
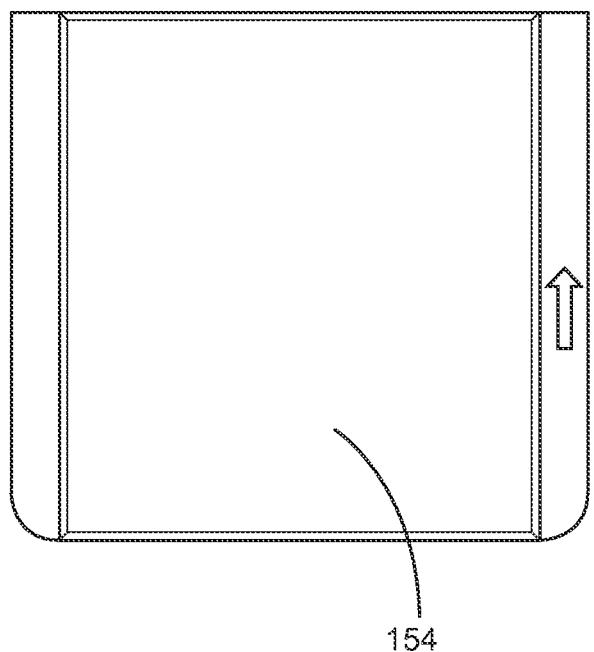
Figure 7I:
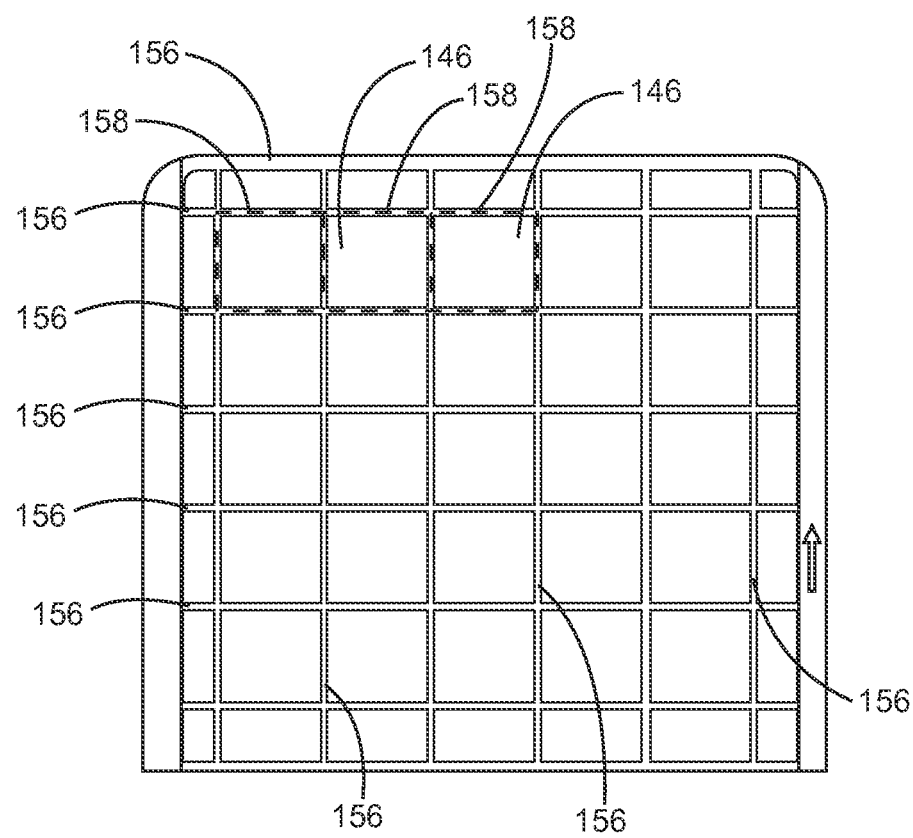

The substrate 133 may form the plurality of component portions 146 in the substrate body 132. In this embodiment, each component portion 146 includes a component area 148 on a surface 150 of the substrate body 132. Next, one or more electronic components 152 may be formed on each component area 148 (FIG. 7G) and then an overmold 154 provided over the surface 150 to cover the component areas 148 (FIG. 7H). Channels 156 are formed along a periphery 158 of each of the component portions 146 (FIG. 7I).

Figure 7J:
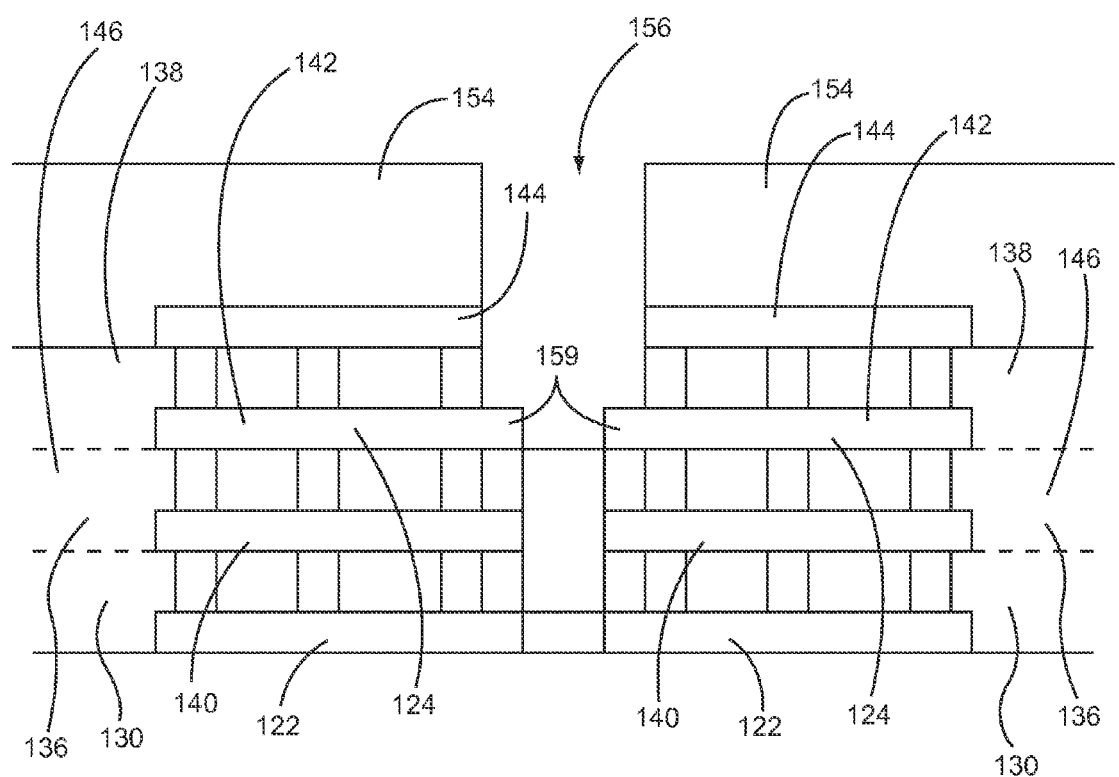
Figure 7K:
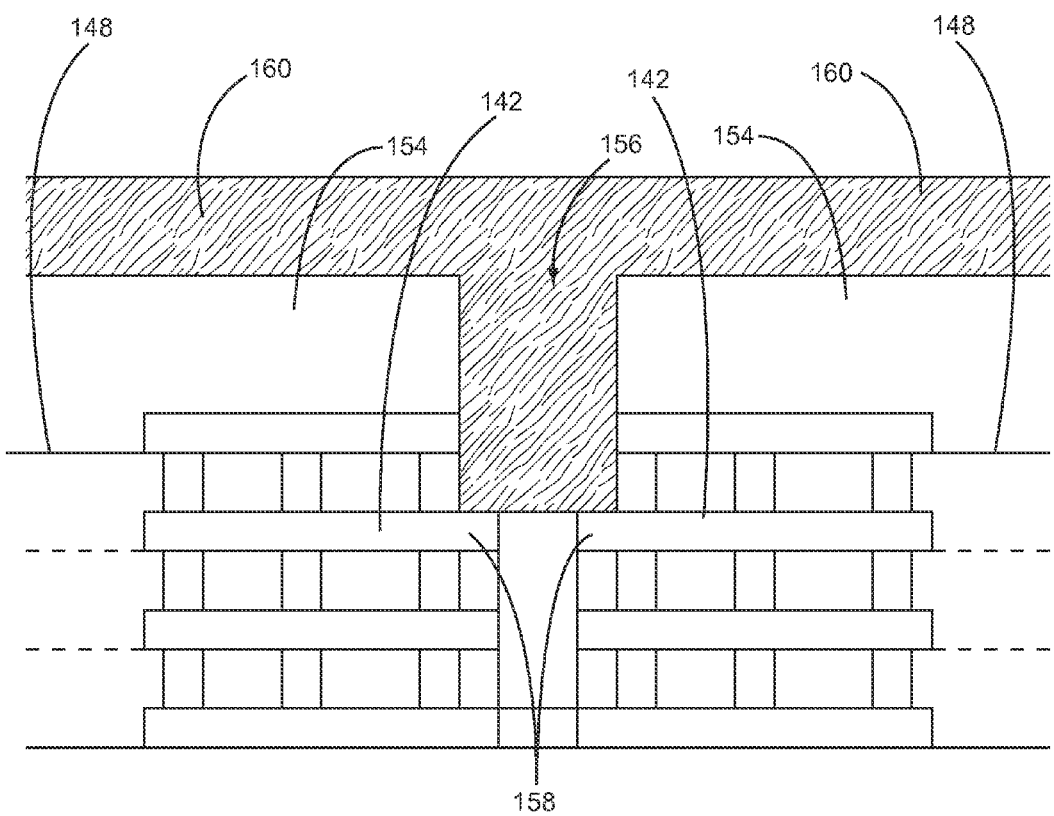
Figure 7L:
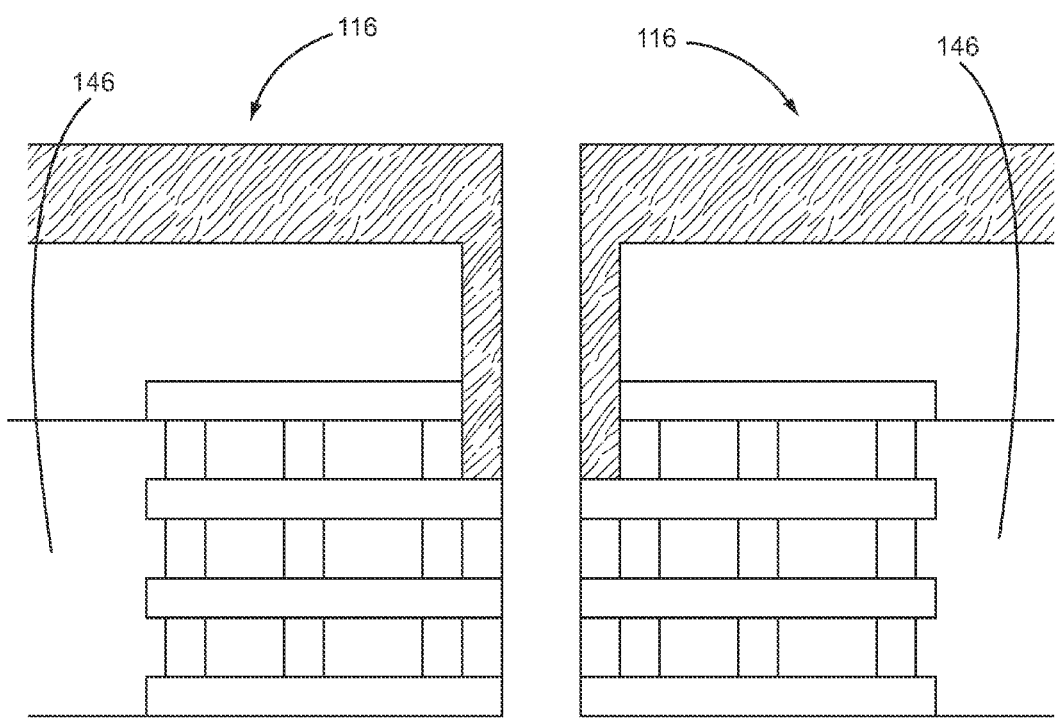

FIG. 7J illustrates a cross sectional view between two component portions 146 after the channels 156 have been formed through the overmold 154 and the fourth metallic layers 144 and the third substrate layers 138. These channels 156 extend through the overmold 154 and the substrate body 132 in accordance with the desired metallic layer 122, 140, 142, 144 to be exposed in the metallic structures 124 of each of the component portions 146. In this embodiment, sections 159 of the third metallic layers 142 are exposed by the channels 156. An electromagnetic shield material is applied over the overmold 154 and within the channels 156 to form electromagnetic shields 160 over the component areas 148 (FIG. 7K). The sections 159 of the third metallic layers 142 are coupled to one of the electromagnetic shields 160. The component portions 146 may be singulated from one another to form individual shielded electronic modules 116 (FIG. 7L).

Figure 8A:
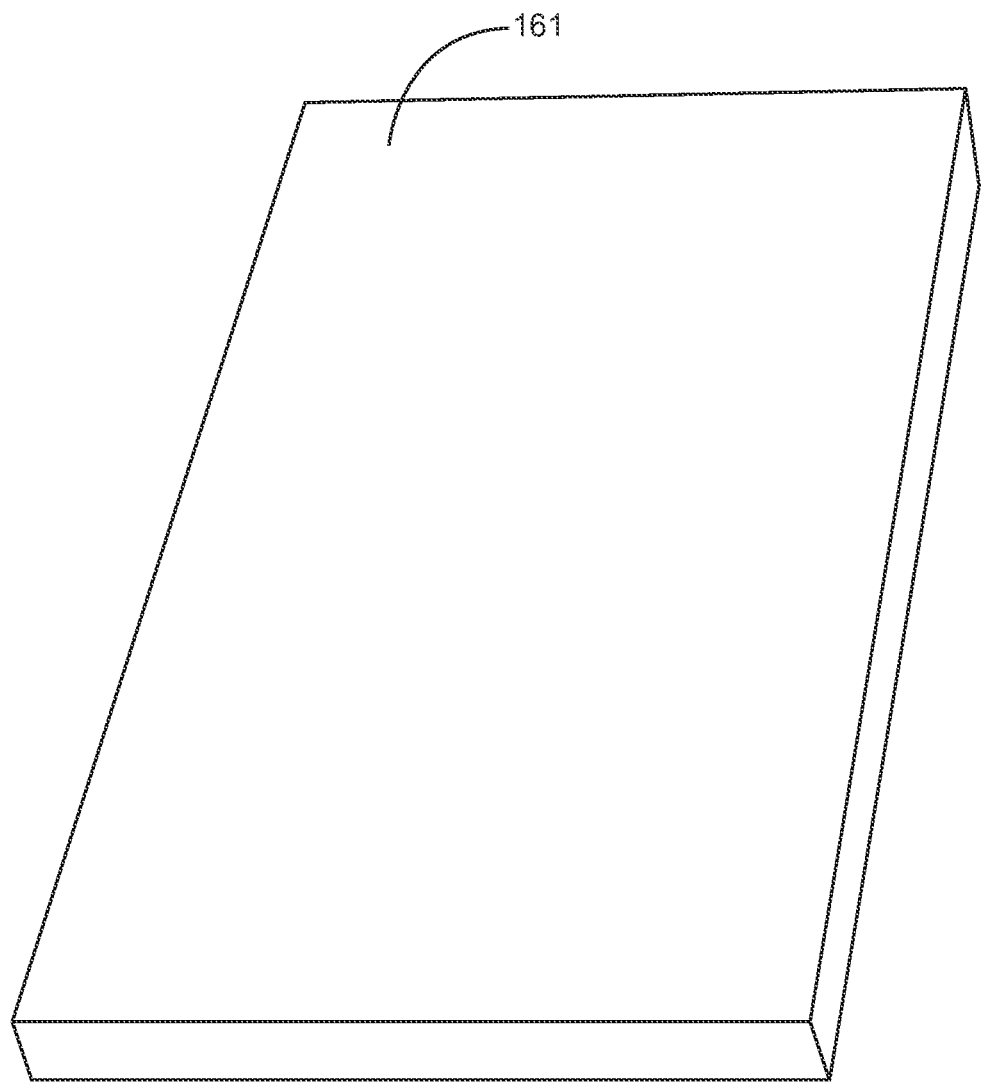
FIG. 8A-8O illustrates steps for forming a second embodiment of the meta-module having a second array of electronic modules.
Figure 8B:
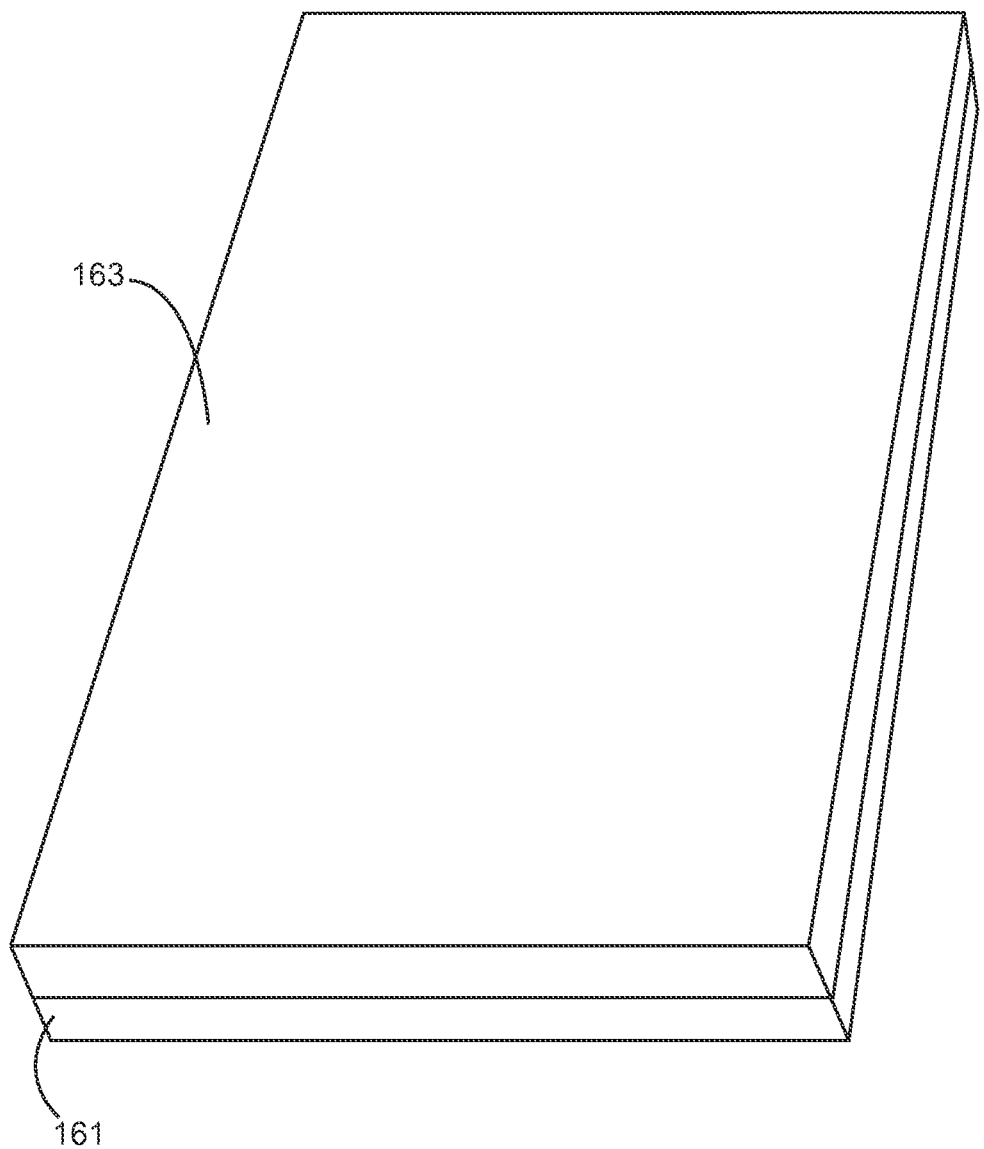
Figure 8C:
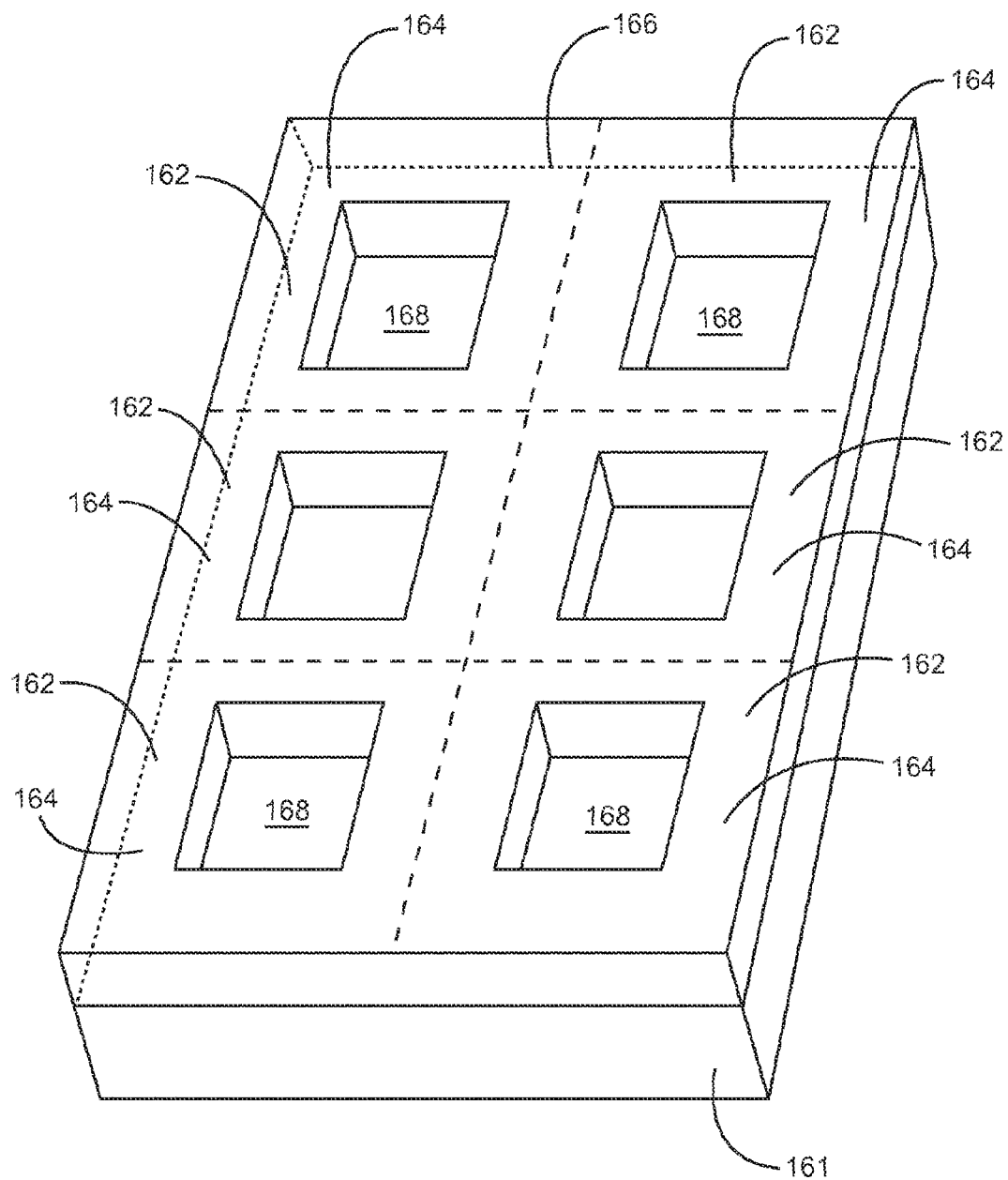

FIGS. 8A-8L illustrates a series of steps for manufacturing another embodiment of an electronic meta-module. To create a substrate for the electronic meta-module, a carrier metallic layer 161 is first provided (FIG. 8A) and a first metallic sheet 163 is formed on the carrier metallic layer 161 (FIG. 8B). Photo lithography may be utilized to form the first metallic sheet 163 into a first metallic layer 162 of a plurality of metallic structures 164 (FIG. 8C). Photo lithography may also be utilized to form circuitry (not shown). This circuitry may form part of the first metallic layers 162, be within the first metallic layers 162, couple the first metallic layers 162, and/or form structures outside of the first metallic layers 162. The first metallic layers 162, illustrated in FIG. 8C, are attached to one another because the plurality of metallic structures 164 are to be built on a meta-metallic structure 166. Also, each of these first metallic layers 162 surrounds an aperture 168.

Figure 8D:
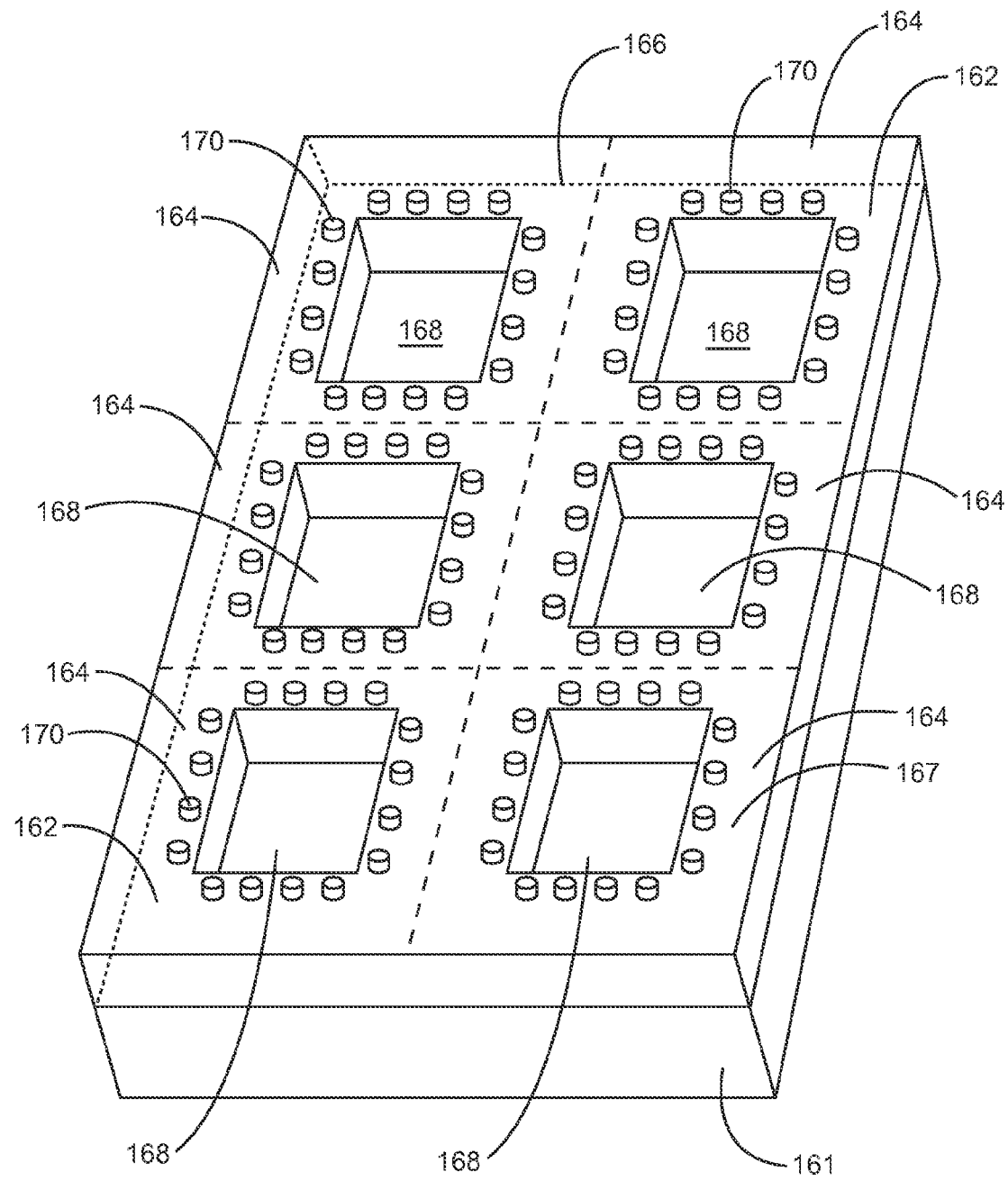
Figure 8E:
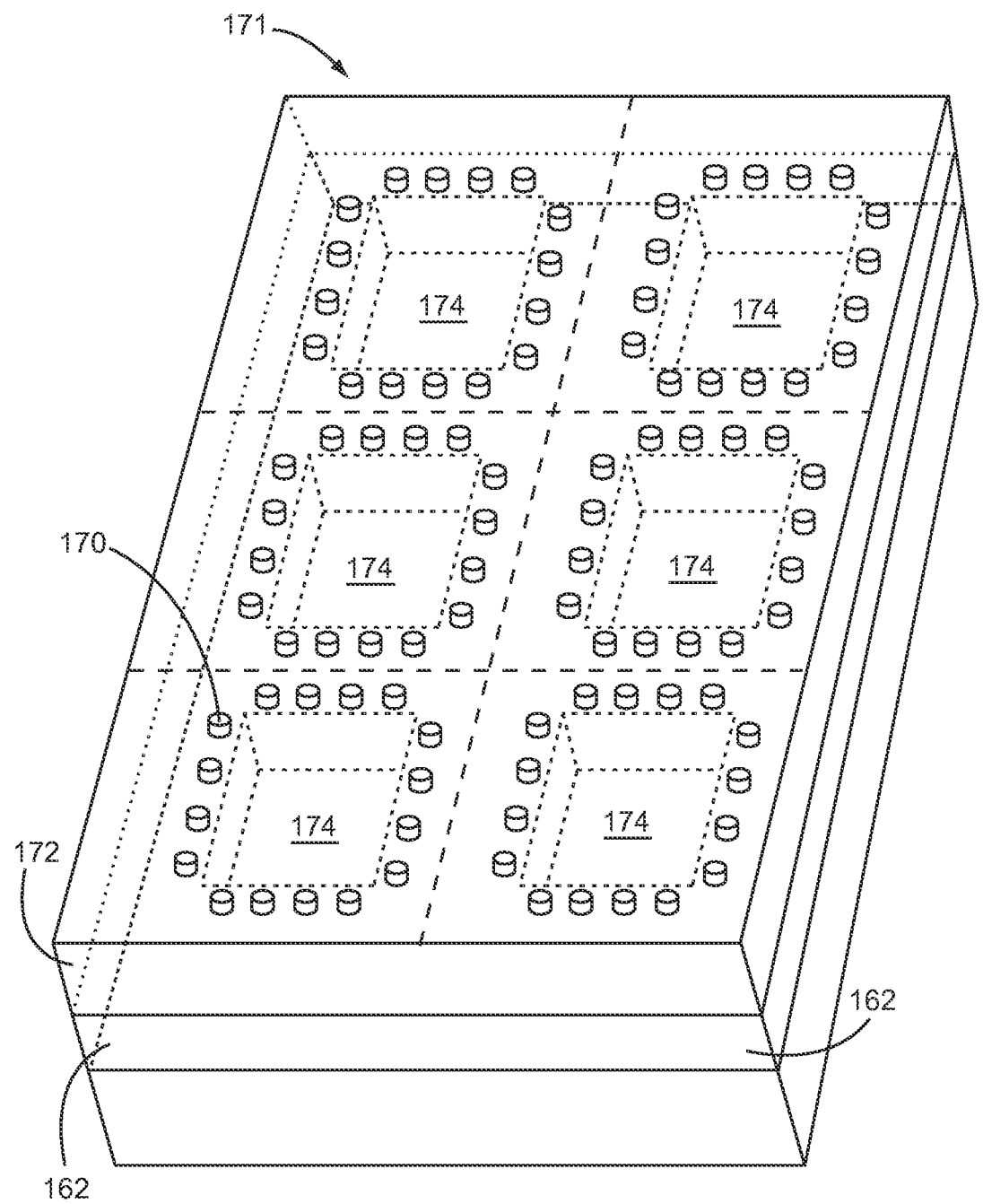

A set of conductive vias 170 may then be formed on each of the first metallic layers 162 of the plurality of metallic structures 164 in the meta-metallic structure 166 (FIG. 8D). In this embodiment, the set of conductive vias 170 are provided around each of the first metallic layers 162. A first substrate layer 172 may then be provided over the first metallic layers 162, within the apertures 168, and the set of conductive vias 170 (FIG. 8E). The first substrate layer 172 may be formed from a dielectric material that is laminated over the first metallic layers 162 and the set of conductive vias 170. When the first substrate layer 172 is initially provided over the first metallic layers 162 and the set of conductive vias 170, the set of conductive vias 170 may extend above the first substrate layer 172. Thus, set of conductive vias 170 may be grinded so that the set of conductive vias 170 are flush with the first substrate layer 172. The first substrate layer 172 forms a part of the substrate body 171 of the substrate. The set of conductive vias 170 of the illustrated embodiment were formed on the first metallic layers 162 prior to providing the first substrate layer 172. In the alternative, the first substrate layer 172 may be provided prior to forming the set of conductive vias 170. Afterwards, holes may be etched into the first substrate layer 172 and a conductive material plated into these holes to form the set of conductive vias 170.

Figure 8F:
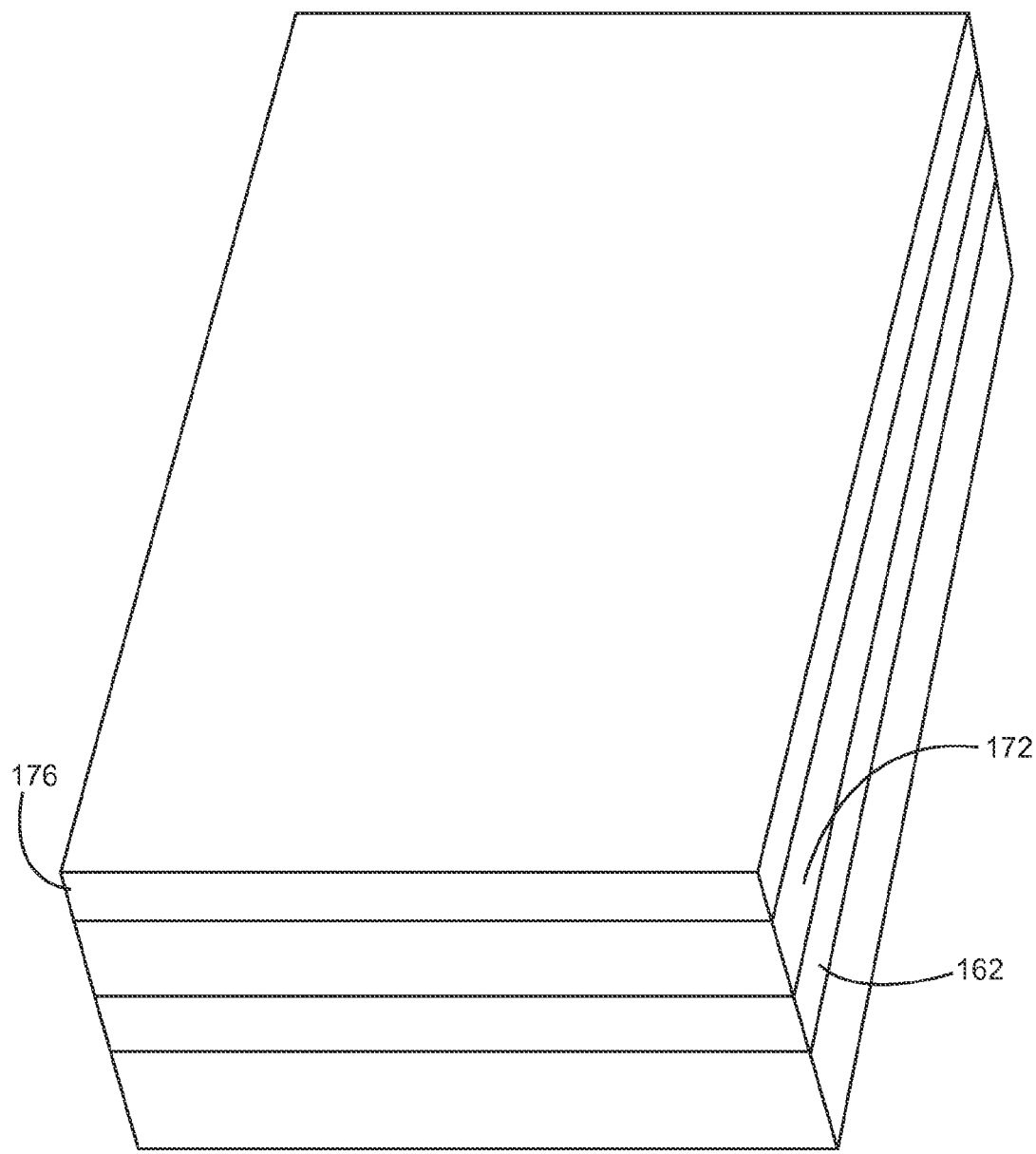
Figure 8G:
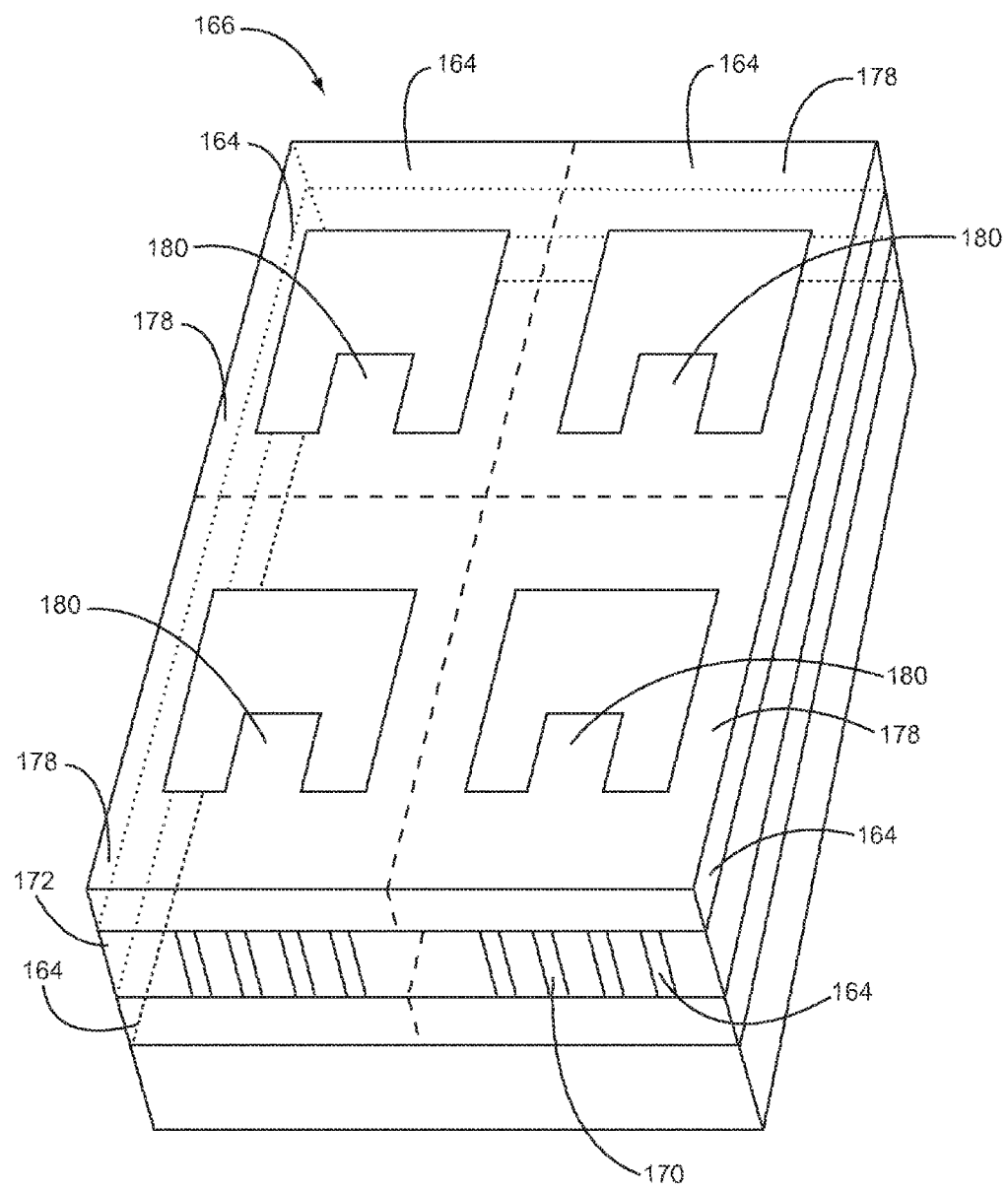
Figure 8H:
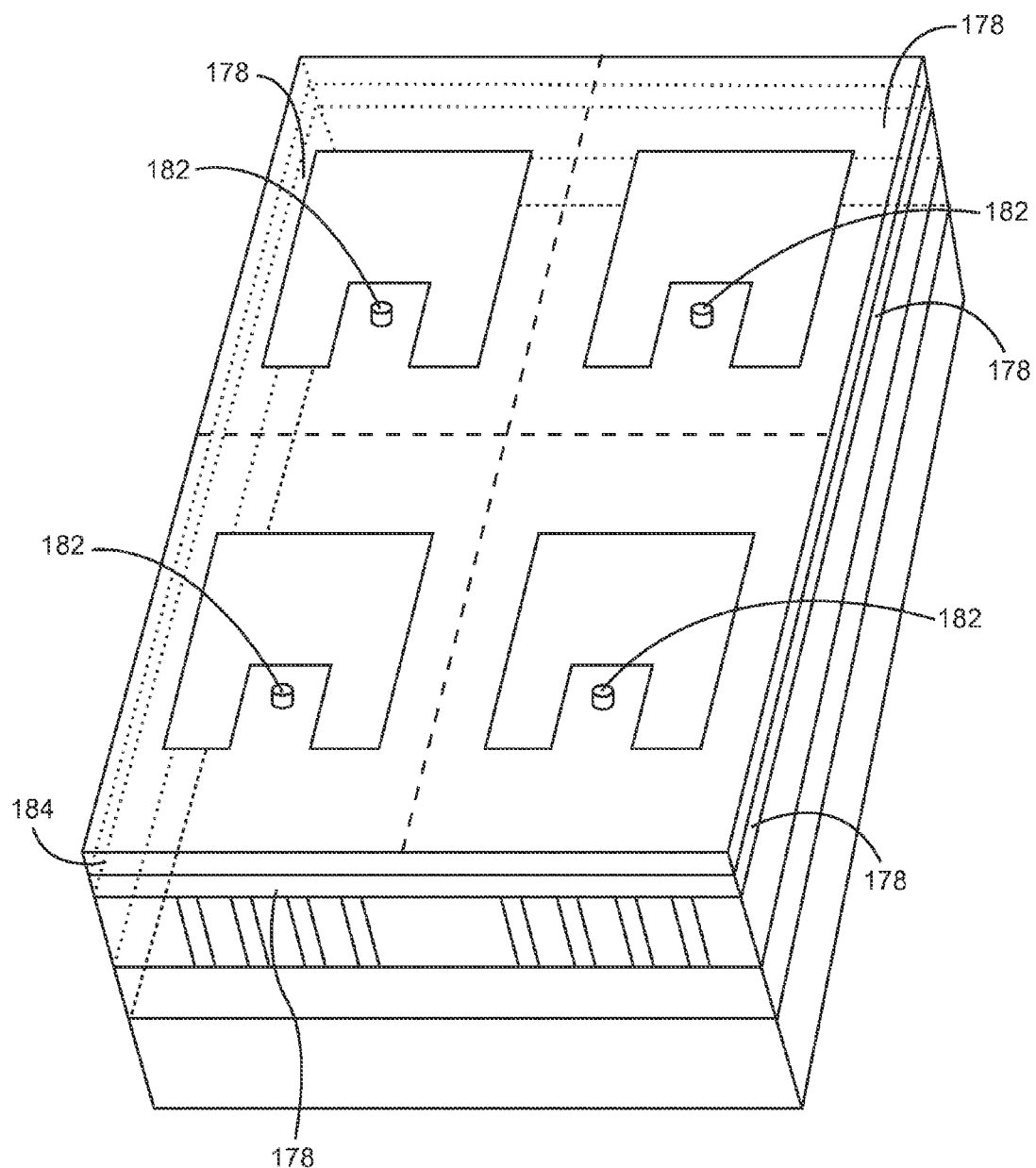

When the first substrate layer 172 is provided, each of the apertures 168 (shown in FIG. 8D) enclosed by the first metallic layers 162 are filled with substrate material and each of the first metallic layers 162 surrounds an area 174 that is part of a component portion within the substrate body 171. Thus, in the illustrated embodiment, the first metallic layer 162 circumscribes the area 174 and defines a section of the periphery of the component portion. Next, a second metallic sheet 176 may be provided over the first substrate layer 172 (FIG. 8F). The second metallic sheet 176 may then be formed into second metallic layers 178 of each of the metallic structures 164 in the meta-metallic structure 166 (FIG. 8G). The second metallic layers 178 in the illustrated embodiment include an extended portion 180. Conductive vias 182 may then be provided on the extended portion 180 of the second metallic layers 178 and a second substrate layer 184 provided over the conductive vias 182 and second metallic layers 178 (FIG. 8H).

Figure 8I:
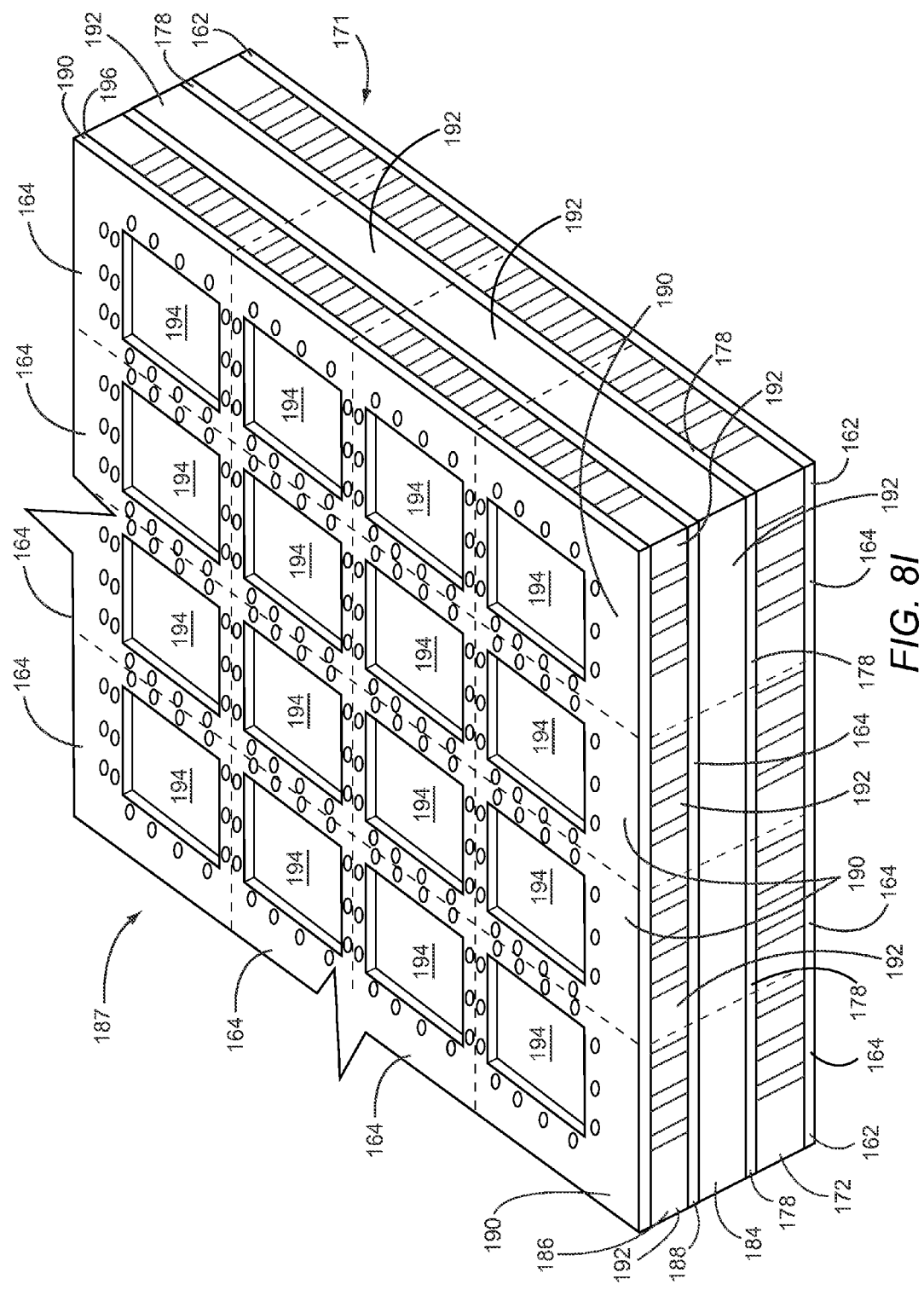
Figure 8J:
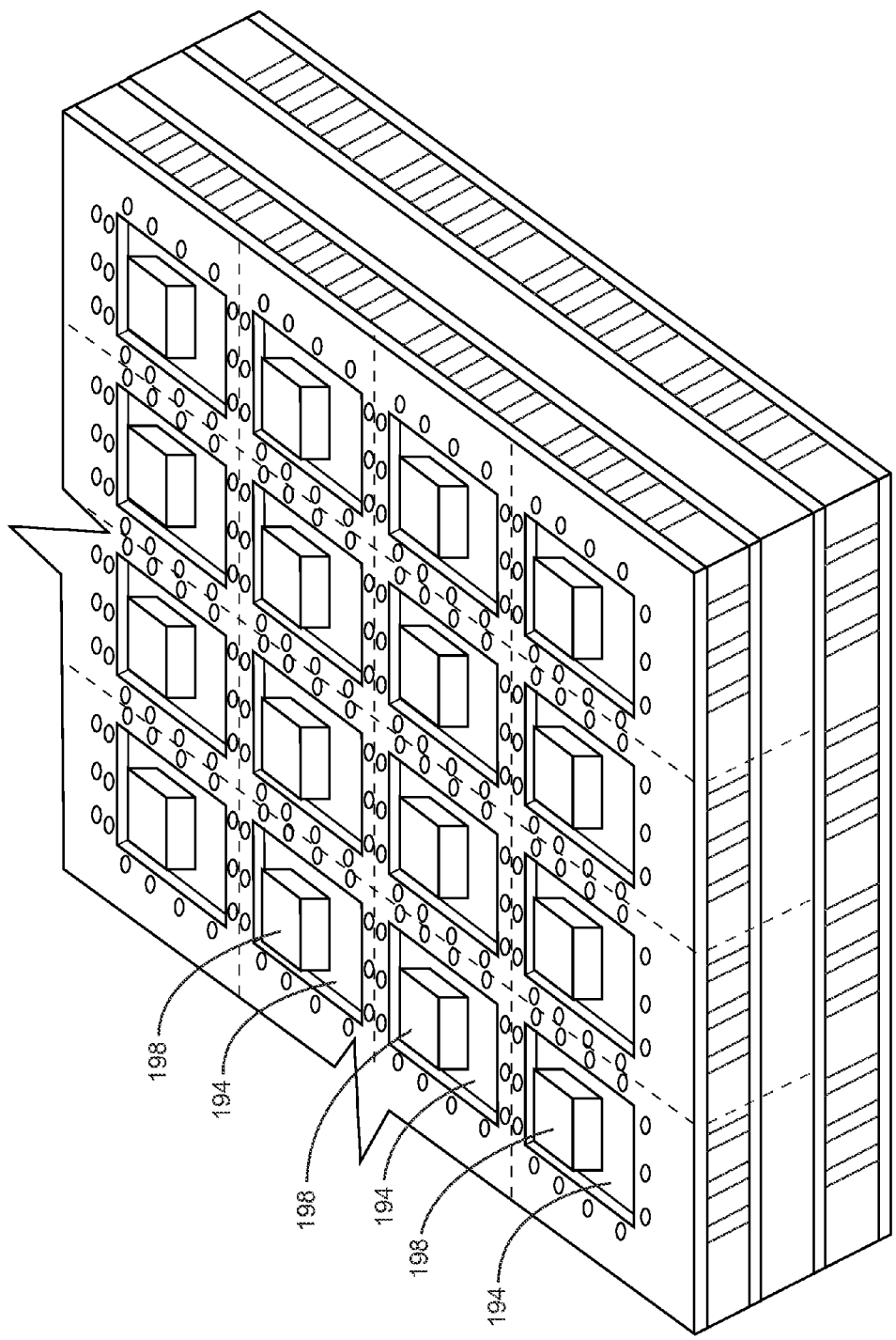
Figure 8K:
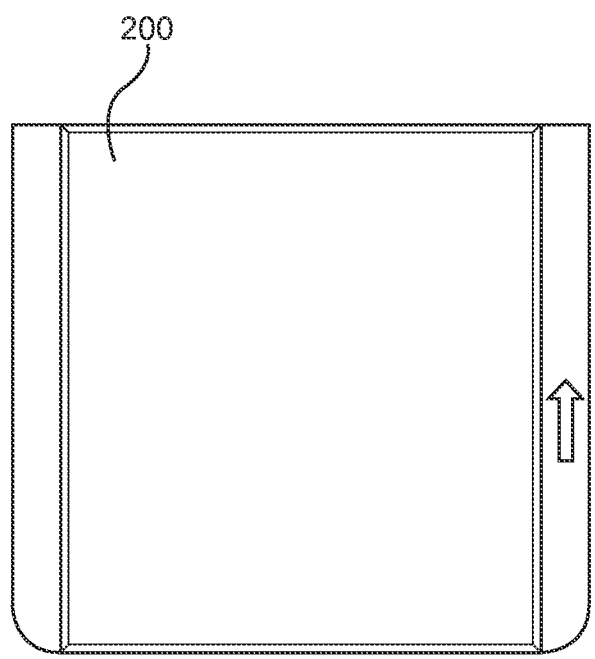
Figure 8L:
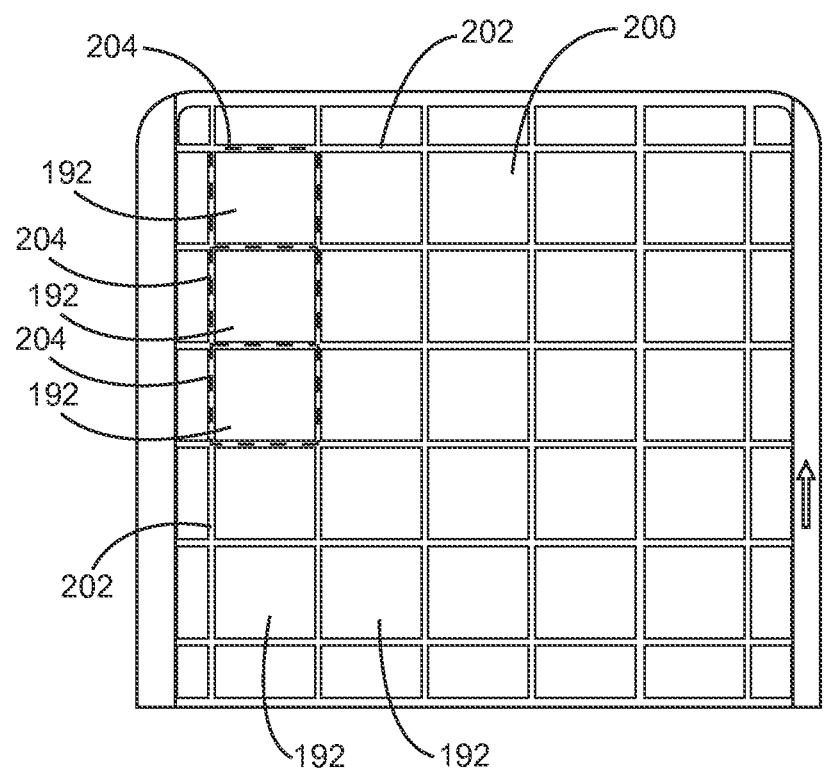

The process described in FIGS. 8A-8H may be repeated to form the desired number of substrate layers 172, 184, 186 in the substrate body 171 of the substrate 187 and first, second, third, and fourth metallic layers 162, 178, 188, 190 in the metallic structures 164 for each component portion 192 (FIG. 8I). The substrate 187 is depicted as having second, third, and fourth metallic layers 178, 188, 190 formed over of the first metallic layer 162. Similarly, the second and third substrate layers 178, 186 are formed over the first substrate layer 172. The substrate 187 thus may be formed to have the plurality of component portions 192 in the substrate body 171. In this embodiment, each component portion 192 includes a component area 194 on a surface 196 of the substrate body 171. Next, one or more electronic components 198 may be formed on each component area 194 (FIG. 8J) and then an overmold 200 provided over the surface 196 to cover the component areas 194 (FIG. 8K). Channels 202 are formed along the periphery 204 of each of the component portions 192 (FIG. 8L).

Figure 8M:
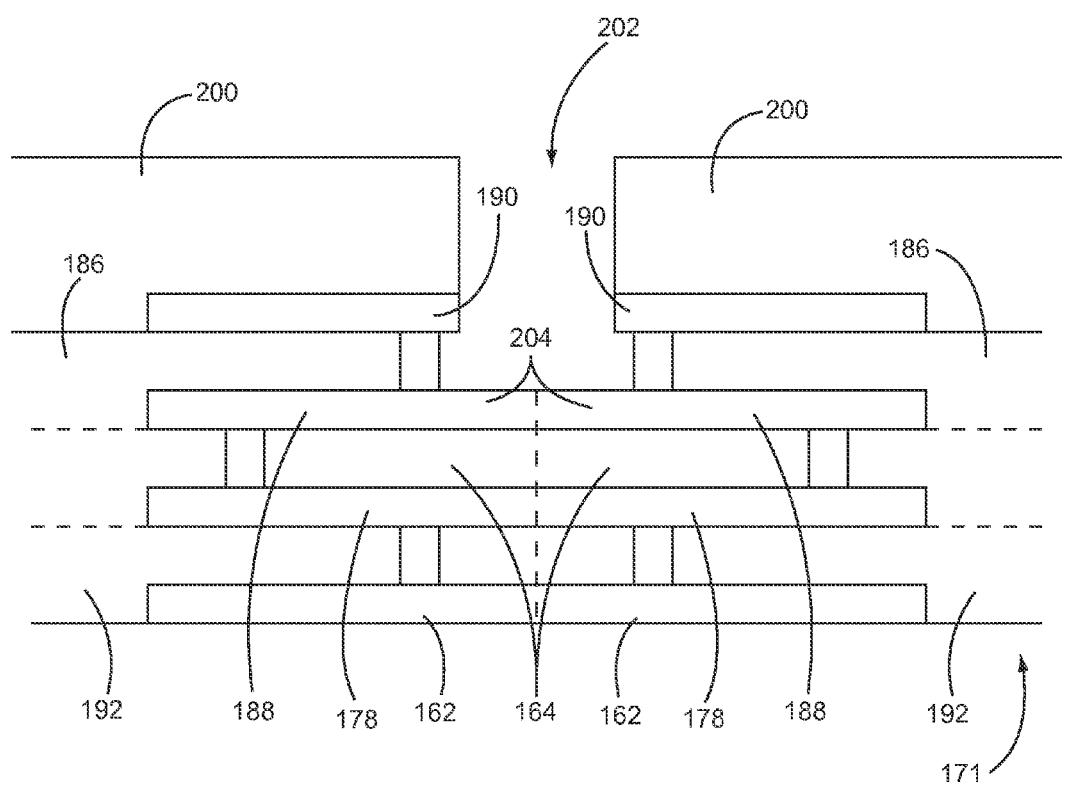
Figure 8N:
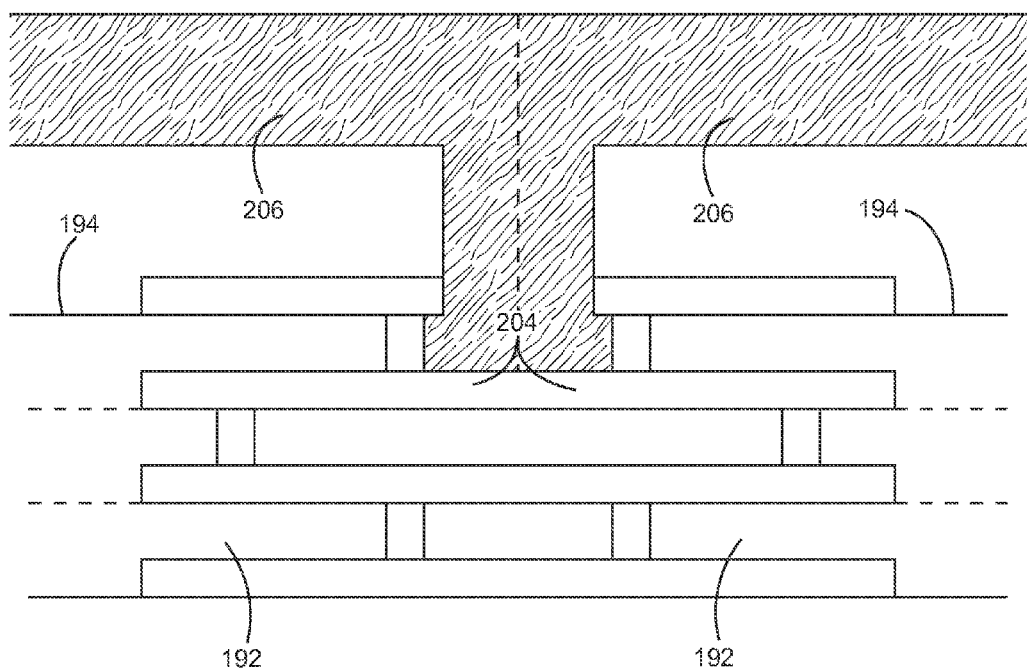
Figure 8O:
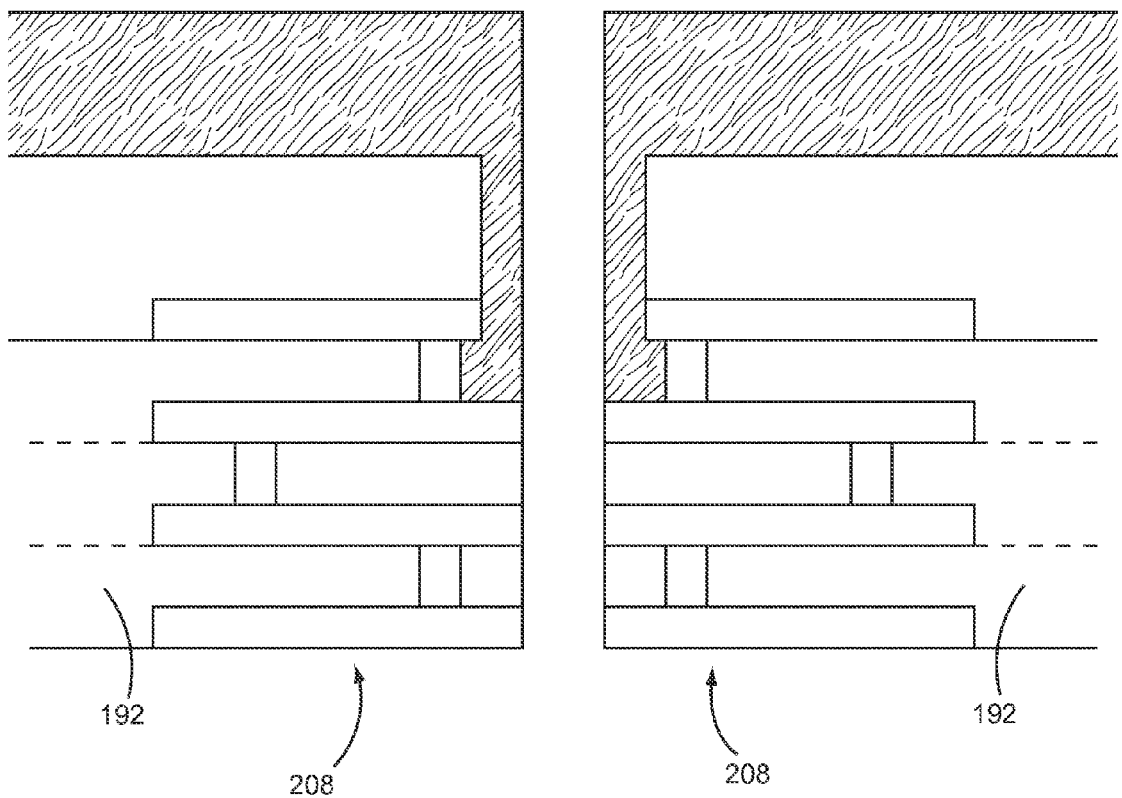

FIG. 8M illustrates a cross sectional view between two component portions 192 after the channels 202 have been formed through the overmold 200 and the fourth metallic layers 190 and the third substrate layers 186. These channels 202 extends through the overmold 200 and the substrate body 171 in accordance with the desired metallic layer 162, 178, 188, 190 to be exposed in the metallic structures 164 of each of the component portions 192. In this embodiment, sections 204 of the third metallic layers 188 are exposed by the channels 202. An electromagnetic shield material is applied over the overmold 200 and within the channels 202 to form electromagnetic shields 206 over the component areas 194 (FIG. 8N). The sections 204 of the third metallic layers 188 are coupled to one of the electromagnetic shields 206. The component portions 192 may be singulated from one another to form individual shielded electronic modules 208 (FIG. 8O).

Those skilled in the art will recognize improvements and modifications to the preferred embodiments of the present disclosure. All such improvements and modifications are considered within the scope of the concepts disclosed herein and the claims that follow.

What is claimed is:
1. An electronic module comprising:
a substrate comprising a component portion including a component area on a surface of the substrate and a plurality of metallic layers each extending along a periphery of the component portion below the surface of the substrate such that the plurality of metallic layers surround the component portion and are coupled to one another;

an electronic component on the component area;

an overmold formed over the component area; and an electromagnetic shield formed over the overmold and covering the component area, the electromagnetic shield being coupled along the periphery of the component portion to at least a first metallic layer in the plurality of metallic layers.

2. The electronic module of claim 1, further comprising a plurality of conductive vias that couple the plurality of metallic layers.

3. The electronic module of claim 1, wherein the plurality of metallic layers further comprises:
  wherein the first metallic layer is on the surface of the substrate and extends along a perimeter of the component area; and
  a second metallic layer within the substrate that is positioned below the first metallic layer.

4. The electronic module of claim 3, further comprising:
  wherein the first metallic layer substantially surrounds the perimeter of the component area, and the second metallic layer substantially surrounds the periphery of the component portion; and
  a first plurality of conductive vias positioned between the first and second metallic layers and substantially surrounding the periphery of the component portion.

5. The electronic module of claim 4, further comprising:
  the plurality of metallic layers further comprising a third metallic layer that extends along the periphery of the component portion and is below the first and second metallic layers; and
  a second plurality of conductive vias positioned between the second and third metallic layers and substantially surrounding the periphery of the component portion.

6. The electronic module of claim 1, wherein the plurality of metallic layers further comprise:
  wherein the first metallic layer is below the component area; and
  a second metallic layer within the substrate that is positioned below the first metallic layer.

7. The electronic module of claim 6, further comprising:
  wherein the first metallic layer substantially surrounds the periphery of the component portion;
  wherein the second metallic layer substantially surrounds the periphery of the component portion; and
  a first plurality of conductive vias positioned between the first and second metallic layer and substantially surrounding the periphery of the component portion.

8. The electronic module of claim 1, further comprising:
  the plurality of metallic layers including a second metallic layer within the substrate wherein the second metallic layer is positioned below the first metallic layer and each of the first and second metallic layers have an extended section that extends from the periphery and into the component portion; and
  at least one conductive vias that couples each of the extended sections of the first and second metallic layers.

* * * * *